US010964683B2

(12) United States Patent
Fujiwara et al.

(10) Patent No.: US 10,964,683 B2
(45) Date of Patent: Mar. 30, 2021

(54) MEMORY ARRAY CIRCUIT AND METHOD OF MANUFACTURING THE SAME

(71) Applicant: TAIWAN SEMICONDUCTOR MANUFACTURING COMPANY, LTD., Hsinchu (TW)

(72) Inventors: Hidehiro Fujiwara, Hsinchu (TW); Hung-Jen Liao, Hsinchu (TW); Hsien-Yu Pan, Hsinchu (TW); Chih-Yu Lin, Taichung (TW); Yen-Huei Chen, Jhudong Township (TW); Sahil Preet Singh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 268 days.

(21) Appl. No.: 15/904,959

(22) Filed: Feb. 26, 2018

(65) Prior Publication Data

US 2019/0067264 A1    Feb. 28, 2019

Related U.S. Application Data

(60) Provisional application No. 62/552,358, filed on Aug. 30, 2017.

(51) Int. Cl.
*H01L 27/02* (2006.01)
*H01L 27/11* (2006.01)
(Continued)

(52) U.S. Cl.
CPC .......... *H01L 27/0207* (2013.01); *G11C 5/063* (2013.01); *G11C 7/18* (2013.01); *H01L 23/5226* (2013.01); *H01L 27/1104* (2013.01)

(58) Field of Classification Search
CPC ............. H01L 27/0207; H01L 27/1104; H01L 23/5226; G11C 5/063; G11C 7/18
See application file for complete search history.

(56) References Cited

U.S. PATENT DOCUMENTS 5,966,315 A      10/1999  Muller et al.
7,812,407 B2 *   10/2010  Liaw ................. G11C 11/412
                                                   257/390
(Continued)

FOREIGN PATENT DOCUMENTS

CN      106531207       3/2017
DE      102016114698    6/2017
(Continued)

OTHER PUBLICATIONS

Office Action dated Oct. 10, 2018 from corresponding application No. DE 10 2018 104 878.5.
(Continued)

*Primary Examiner* — Marcos D. Pizarro
(74) *Attorney, Agent, or Firm* — Hauptman Ham, LLP

(57) ABSTRACT

A memory array includes a column of cells arranged along a first direction and a bit line extending along the first direction over the column of cells. The column of cells includes a set of memory cells and a set of strap cells. The bit line includes a first conductor in a second conductor. The first conductor extends in the first direction and is in a first conductive layer. The second conductor extends in the first direction and is in a second conductive layer different from the first conductive layer.

20 Claims, 11 Drawing Sheets

(51) Int. Cl.
*H01L 23/522* (2006.01)
*G11C 5/06* (2006.01)
*G11C 7/18* (2006.01)

(56) References Cited

U.S. PATENT DOCUMENTS

| | | |
|---|---|---|
| 9,362,292 B1 | 6/2016 | Liaw |
| 9,691,471 B2 | 6/2017 | Liaw |
| 2012/0236628 A1 | 9/2012 | Ikeda et al. |
| 2013/0235640 A1* | 9/2013 | Liaw .................. H01L 27/1104 365/63 |
| 2017/0076755 A1 | 3/2017 | Chang et al. |
| 2017/0221905 A1 | 8/2017 | Chen et al. |
| 2019/0172501 A1 | 6/2019 | Chang et al. |

FOREIGN PATENT DOCUMENTS

| | | |
|---|---|---|
| KR | 20040092342 | 11/2004 |
| KR | 20160032049 | 3/2016 |
| KR | 20170031069 | 3/2017 |

OTHER PUBLICATIONS

Office Action dated Jun. 28, 2019 from corresponding application No. KR 10-2018-0060974.
Office Action dated Jul. 29, 2019 from corresponding application No. TW 107122155.
Office Action dated Apr. 30, 2020 from corresponding application No. CN 201810995756.2.
Office Action dated Jan. 27, 2021 for corresponding case No. CN 201810995756.2 (pp. 1-12).

* cited by examiner

MEMORY ARRAY CIRCUIT AND METHOD OF MANUFACTURING THE SAME

PRIORITY CLAIM AND CROSS-REFERENCE

This application claims the benefit of U.S. Provisional Application No. 62/552,358, filed Aug. 30, 2017, which is herein incorporated by reference in its entirety.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistance of conductive lines within these digital devices are also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
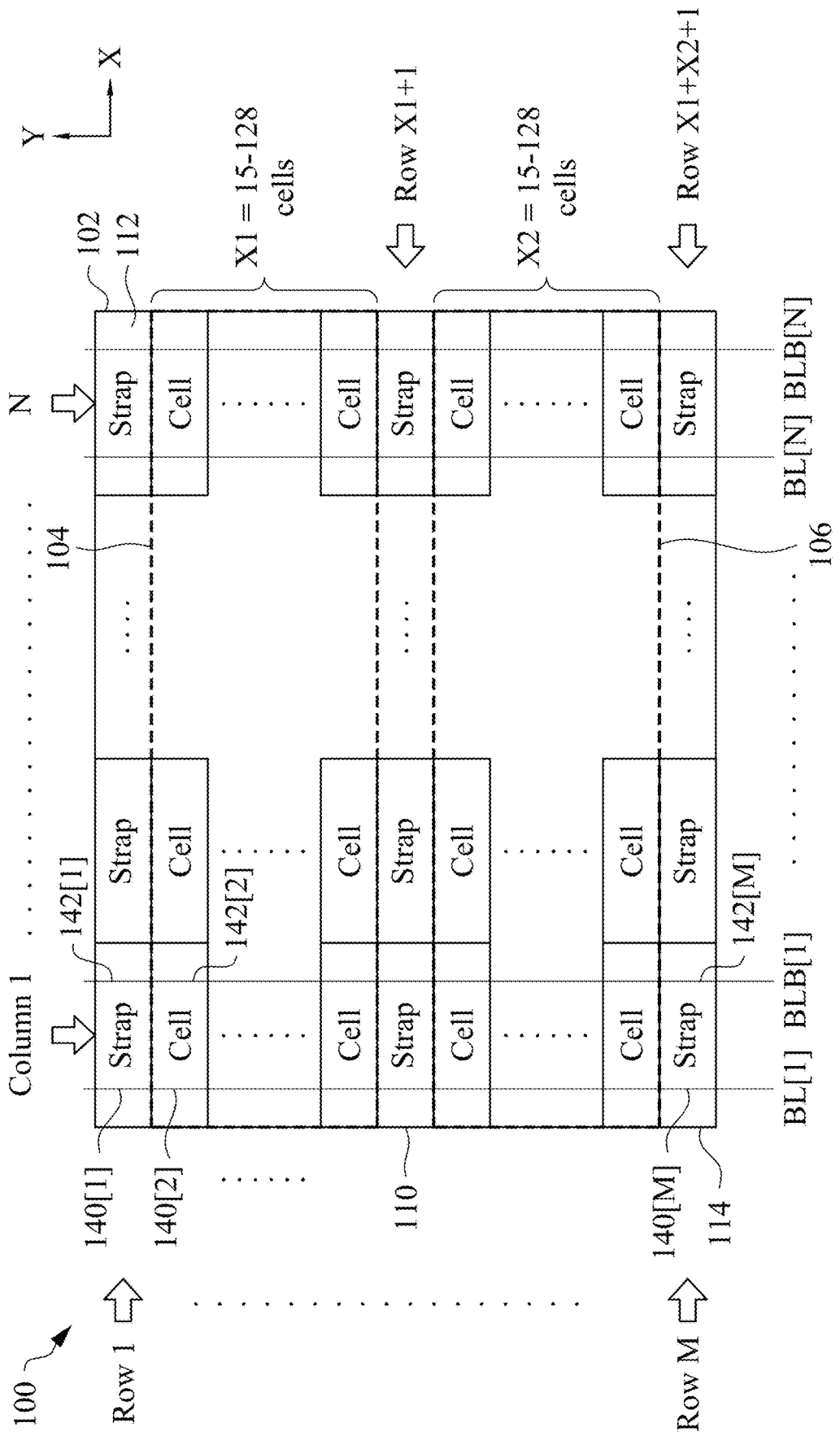
FIG. 1 is a circuit diagram of a memory macro, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory array includes a column of cells arranged along a first direction and a bit line extending along the first direction over the column of cells. The column of cells includes a set of memory cells and a set of strap cells. The bit line includes a first conductor and a second conductor. The first conductor extends in the first direction and is in a first conductive layer. The second conductor extends in the first direction and is in a second conductive layer different from the first conductive layer. In some embodiments, the first conductor is on a first metal level (for example, a layer referred to as an M1 layer). In some embodiments, the second conductor is on a second metal level (for example, a layer referred to as an M3 layer). In some embodiments, the first conductor and the second conductor are electrically coupled to each other by a first via, a second via and a third conductor.

In some embodiments, the first conductor and the second conductor form a bit line BL or a bit line bar BLB. In some embodiments, by using a bit line BL or a bit line bar BLB on multiple conductive layers, the resistance of the bit line BL or a bit line bar BLB of the memory array is reduced compared with other approaches. In some embodiments, by reducing the resistance of the bit line BL or a bit line bar BLB, a length of the bit line BL or bit line bar BLB of the memory array is longer than other approaches, resulting in a larger array of memory cells than other approaches.

FIG. 1 is a circuit diagram of a memory macro 100, in accordance with some embodiments. In the embodiment of FIG. 1, memory macro 100 is a static random access memory (SRAM) macro. SRAM is used for illustration, and other types of memories are within the scope of various embodiments.

Memory macro 100 comprises an array of cells 102 having M rows and N columns, where N is a positive integer corresponding to the number of columns in array of cells 102 and M is a positive integer corresponding to the number of rows in array of cells 102. The columns of cells in array of cells 102 are arranged in a first direction Y. The rows of cells in array of cells 102 are arranged in a second direction X. The second direction X is different from the first direction Y. In some embodiments, the second direction is perpendicular to the first direction.

Memory macro 100 further includes N bit lines BL[1], . . . BL[N] (collectively referred to as "bit line BL") and N bit line bars BLB[1], . . . BLB[N] (collectively referred to as "bit line bar BLB"). Each column 1, . . . , N in array of cells 102 is overlapped by a corresponding bit line BL[1], . . . , BL[N] and a corresponding bit line bar BLB[1], . . . , BLB[N]. Each bit line BL or bit line bar BLB extends in the first direction Y and over a column of cells (e.g., column 1, . . . , N).

Note that the term "bar" as used in this context indicates a logically inverted signal, for example, bit line bar BLB[1], . . . BLB[N] carries a signal logically inverted from a signal carried by bit line BL[1], . . . BL[N].

Each cell in array of cells 102 comprises a bit line segment 140[1], . . . , 140[M] (collectively referred to as a "bit line segment 140") extending in the first direction Y, a bit line bar segment 142[1], . . . , 142[M] (collectively referred to as a "bit line bar segment 142") extending in the first direction Y, and a word line segment WL (not shown) extending in the second direction X.

The bit line segment 140[1], . . . , 140[M] of each cell in array of cells 102 is coupled with the bit line segments 140[1], . . . , 140[M] of adjacent cells in array of cells 102 in a same column of memory macro 100 to form a bit line BL across memory macro 100.

The bit line bar segment 142[1], . . . , 142[M] of each cell in array of cells 102 is coupled with the bit line bar segments 142[1], . . . , 142[M] of adjacent cells in array of cells 102 in a same column of memory macro 100 to form a bit line bar BLB across memory macro 100. In some embodiments, the bit line BL or bit line bar BLB comprises a first conductor 302 (FIGS. 3A-3B) in a first conductive layer (M1), and extending in the first direction Y, and a second conductor 304 (FIGS. 3A-3B) in a second conductive layer (M3) different from the first conductive layer.

The word line portion WL (not shown) of each cell in array of cells 102 is coupled with the word line portions (not shown) of adjacent cells in array of cells 102 in a same row of memory macro 100 to form a word line (not shown) across memory macro 100 in the second direction X.

The memory cells in array of cells 102 are divided into a first memory cell array 104, a second memory cell array 106, a first set of strap cells 110, a second set of strap cells 112 and a third set of strap cells 114. The first memory cell array 104 and the second memory cell array 106 are separated by the first set of strap cells 110.

First memory cell array 104 includes an array of memory cells including X1 rows by N columns, where X1 is a positive integer corresponding to the number of rows in first memory cell array 104. In some embodiments, X1 ranges from 15 to 128.

Second memory cell array 106 includes an array of memory cells including X2 rows by N columns, where X2 is a positive integer corresponding to the number of rows in second memory cell array 106. In some embodiments, X2 ranges from 15 to 128.

In some embodiments, first memory cell array 104 or second memory cell array 106 includes one or more single port (SP) SRAM cells. In some embodiments, first memory cell array 104 or second memory cell array 106 includes one or more dual port (DP) SRAM cells. Different types of memory cells in first memory cell array 104 or second memory cell array 106 are within the contemplated scope of the present disclosure.

First set of strap cells 110 are positioned between the first memory cell array 104 and the second memory cell array 106. First set of strap cells 110 includes N strap cells. First set of strap cells 110 is arranged in row X1+1 of memory macro 100. Row X1+1 is arranged in the second direction X.

The second set of strap cells 112 and the third set of strap cells 114 bracket the first memory cell array 104 and the second memory cell array 106.

Second set of strap cells 112 includes N strap cells. Second set of strap cells 112 is arranged in row 1 of memory macro 100. Row 1 is arranged in the second direction X.

Second set of strap cells 112 and first set of strap cells 110 bracket the first memory cell array 104.

Third set of strap cells 114 includes N strap cells. Third set of strap cells 114 is arranged in row X1+X2+1 of memory macro 100. Row X1+X2+1 is arranged in the second direction X.

First set of strap cells 110 and second set of strap cells 112 bracket the first memory cell array 104. First set of strap cells 110 and third set of strap cells 114 bracket the second memory cell array 106. Memory macro 100 can be utilized in combination with layout design 400 of FIG. 4 and layout design 500 of FIG. 5. In some embodiments, layout design 400 is usable by system 900 to manufacture one or more strap cells in the first set of strap cells 110, second set of strap cells 112 or third set of strap cells 114. In some embodiments, layout design 500 is usable by system 900 to manufacture one or more cells in the first memory cell array 104 or second memory cell array 106.

In some embodiments, strap cells in the first set of strap cells 110, second set of strap cells 112 or third set of strap cells 114 correspond to dummy SRAM cells. Strap cells in first set of strap cells 110, second set of strap cells 112 or third set of strap cells 114 are memory cells configured to provide voltage pick-up and to provide N-well or P-well bias that prevents voltage drop along a pair of bit lines BL, BLB that result in a difference in memory cell device voltages along the pair of bit lines BL, BLB as the bit lines BL, BLB extend along array of cells 102. In some embodiments, strap cells in the first set of strap cells 110, second set of strap cells 112 or third set of strap cells 114 are edge cells. In some embodiments, strap cells in the first set of strap cells 110, second set of strap cells 112 or third set of strap cells 114 have a same structure as a structure of memory cells in first memory cell array 104 or second memory cell array 106.

Different configurations of array of cells 102 are within the contemplated scope of the present disclosure. In some embodiments, memory macro 100 also includes strap cells (not shown) configured to surround or enclose the perimeter of array of cells 102. For example, in some embodiments array of cells 102 further includes a column of strap cells (not shown) positioned in column 0 of array of cells 102, and another column of strap cells (not shown) positioned in column N+1 of array of cells 102.

In some embodiments, memory macro 100 or memory macro 600 (FIG. 6) has a bit line BL or a bit line bar BLB on multiple conductive layers (shown in FIG. 3), causing the resistance of the bit line BL or the bit line bar BLB of memory macro 100 or 600 to be reduced compared with other approaches. In some embodiments, the resistance of the bit line BL or bit line bar BLB is reduced by 30% to 40% compared to other approaches. In some embodiments, by reducing the resistance of the bit line BL or a bit line bar BLB, a length of the bit line BL or bit line bar BLB of the memory macro 100 or 600 is longer than other approaches, resulting in a larger array of memory cells than other approaches. In some embodiments, the length of the bit line BL or bit line bar BLB extends across at least 512 memory cells in memory macro 100 or memory macro 600 (FIG. 6).

Figure 2:
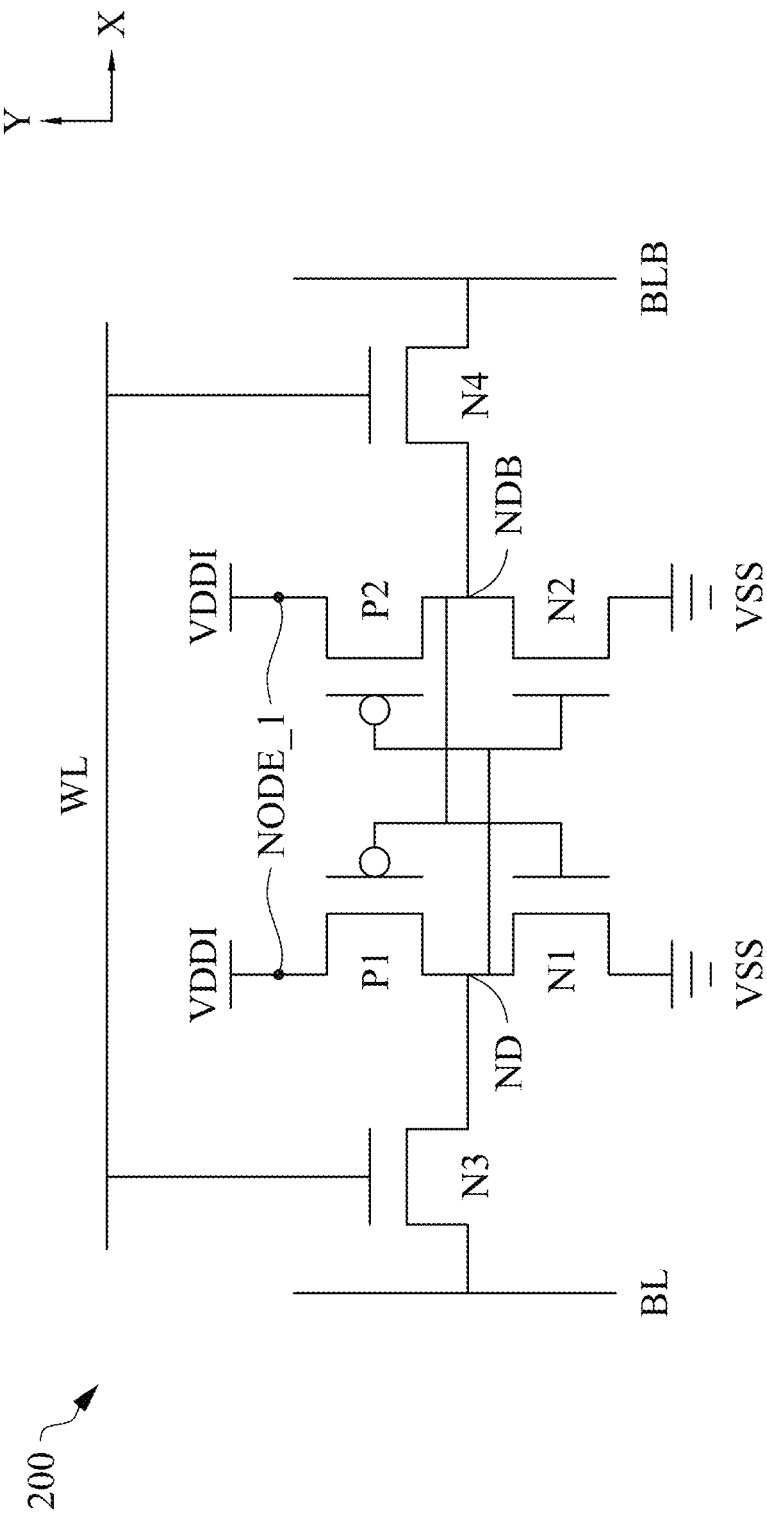
FIG. 2 is a circuit diagram of a memory cell usable in FIG. 1, in accordance with some embodiments.

FIG. 2 is a circuit diagram of a memory cell 200 usable in FIG. 1, in accordance with some embodiments.

Figure 6:
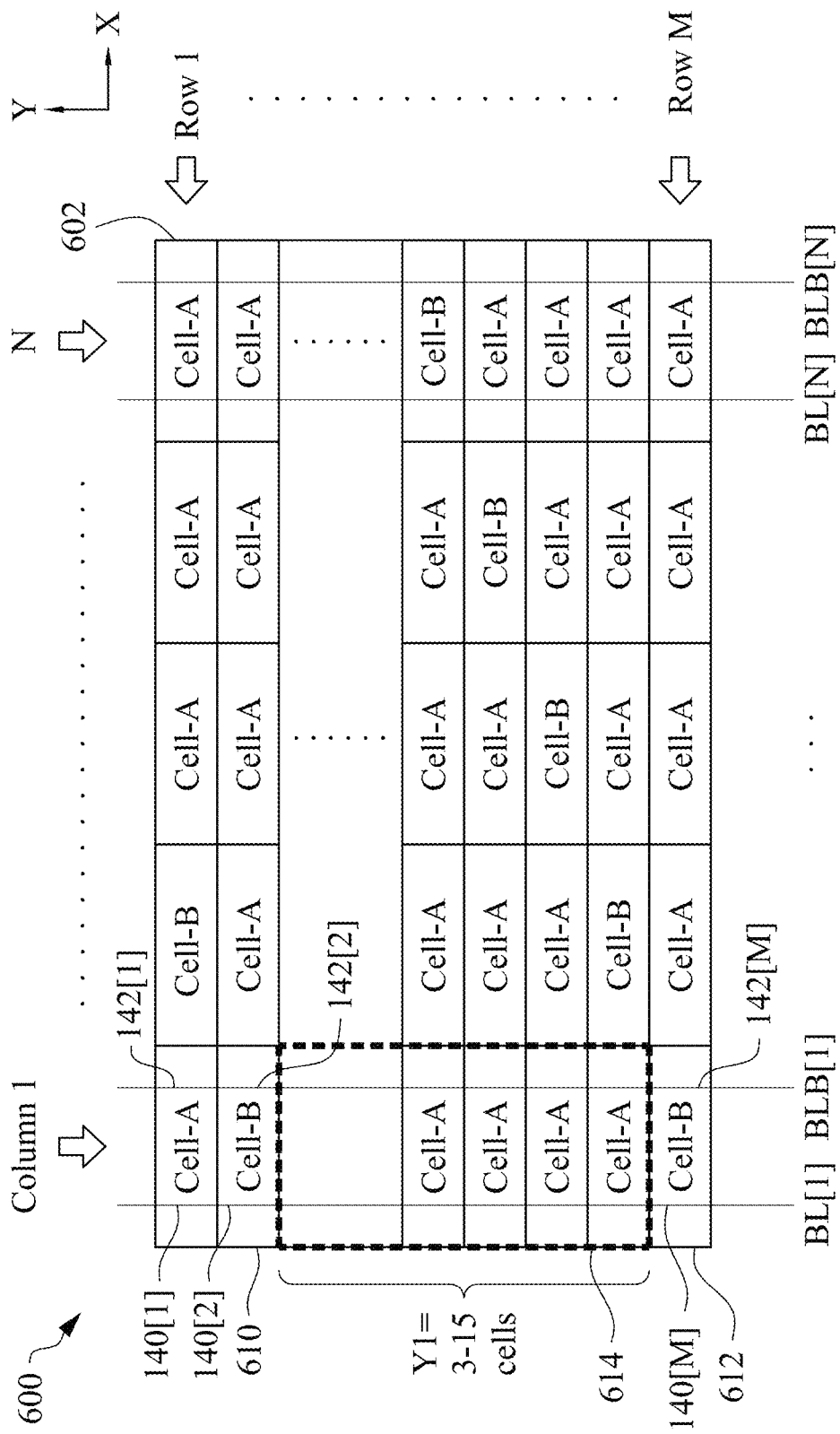
FIG. 6 is a circuit diagram of a memory macro, in accordance with some embodiments.

Memory cell 200 is usable as one or more memory cells in first memory cell array 104 of FIG. 1, second memory cell array 106 of FIG. 1 or memory cell array 602 of FIG. 6.

Memory cell 200 is a six transistor (6T) single port (SP) SRAM memory cell used for illustration. In some embodiments, memory cell 200 employs a number of transistors other than six. Other types of memory are within the scope of various embodiments.

Memory cell 200 comprises two P-type metal oxide semiconductor (PMOS) transistors P1 and P2, and four N-type metal oxide semiconductor (NMOS) transistors N1, . . . , N2, N3, and N4. Transistors P1, P2, N1, and N2 form a cross latch or a pair of cross-coupled inverters. For example, PMOS transistor P1 and NMOS transistor N1 form a first inverter while PMOS transistor P2 and NMOS transistor N2 form a second inverter.

A source terminal of each of PMOS transistors P1 and P2 are configured as a voltage supply node NODE_1. Each voltage supply node NODE_1 is coupled to a first voltage source VDDI. A drain terminal of PMOS transistor P1 is coupled with a drain terminal of NMOS transistor N1, a gate terminal of PMOS transistor P2, a gate terminal of NMOS transistor N2, and a source terminal of NMOS transistor N3, and is configured as a storage node ND.

A drain terminal of PMOS transistor P2 is coupled with a drain terminal of NMOS transistor N2, a gate terminal of PMOS transistor P1, a gate terminal of NMOS transistor N1, and a source terminal of NMOS transistor N4, and is configured as a storage node NDB. A source terminal of each of NMOS transistors N1 and N2 is configured as a supply reference voltage node (not labelled) having a supply reference voltage VSS. The source terminal of each of NMOS transistors N1 and N2 is also coupled to supply reference voltage VSS.

A word line WL is coupled with a gate terminal of each of NMOS transistors N3 and N4. Word line WL is also called a write control line because NMOS transistors N3 and N4 are configured to be controlled by a signal on word line WL in order to transfer data between bit lines BL, BLB and corresponding nodes ND, NDB.

A drain terminal of NMOS transistor N3 is coupled to a bit line BL. A drain terminal of NMOS transistor N4 is coupled to a bit line BLB. Bit lines BL and BLB are configured as both data input and output for memory cell 200. In some embodiments, in a write operation, applying a logical value to a first bit line BL and the opposite logical value to the other bit line BLB enables writing the logical values on the bit lines to memory cell 200. Each of bit lines BL and BLB is called a data line because the data carried on bit lines BL and BLB are written to and read from corresponding nodes ND and NDB.

Figure 3A:
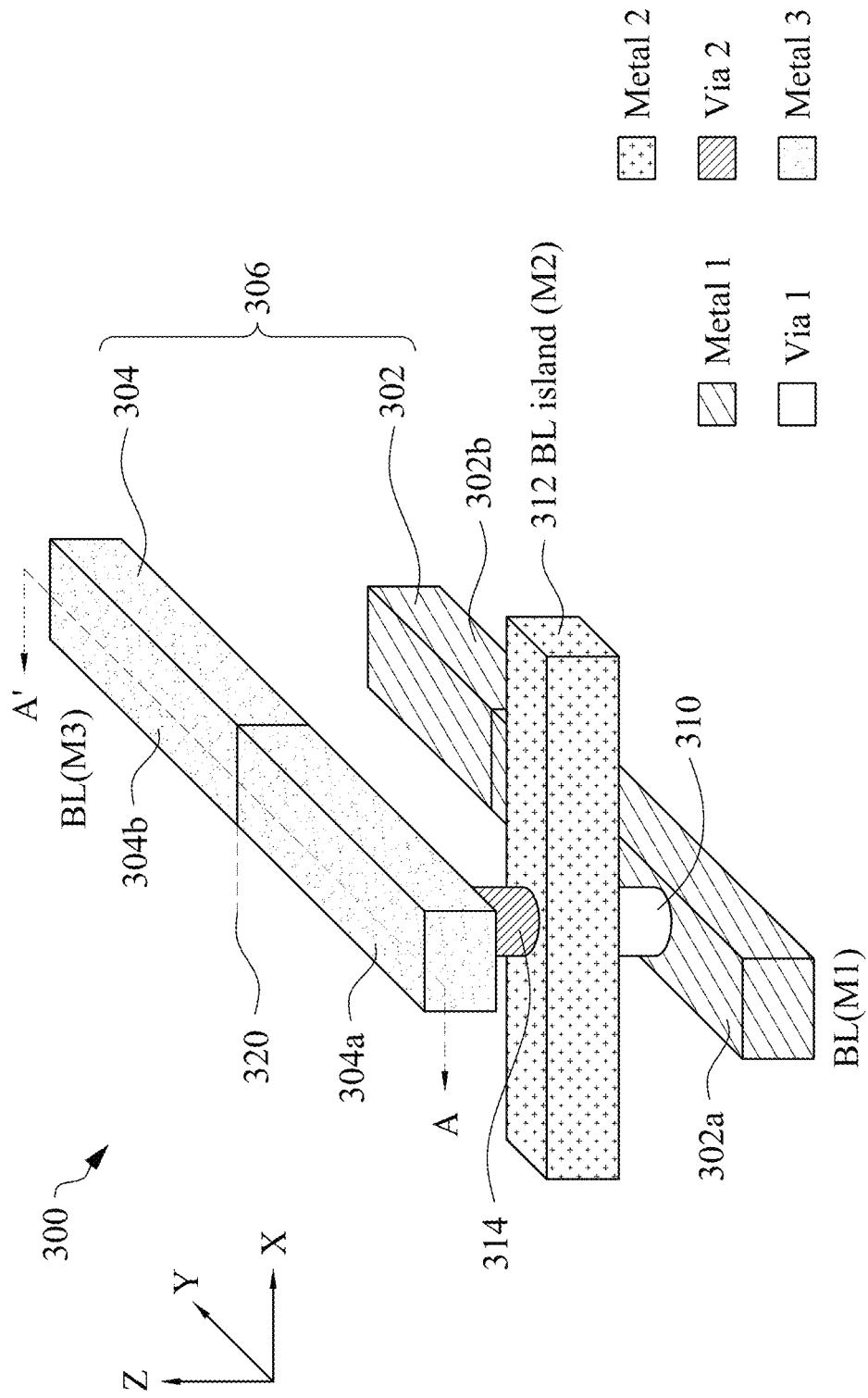
FIGS. 3A and 3B are diagrams of an IC structure, in accordance with some embodiments.
Figure 3B:
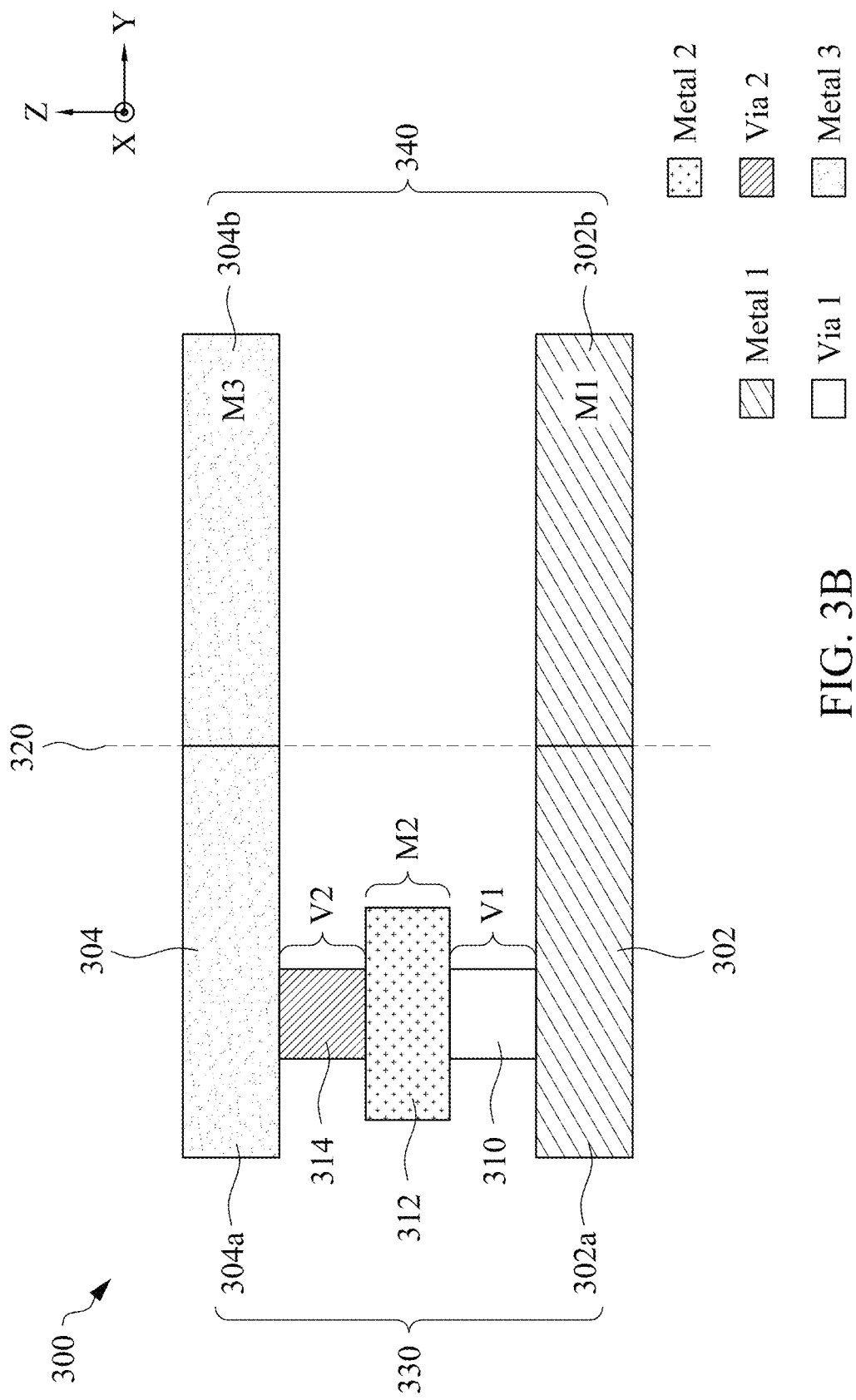

FIGS. 3A and 3B are diagrams of an IC structure 300, in accordance with some embodiments. FIG. 3A is a perspective view of IC structure 300, and FIG. 3B is a cross-sectional view of IC structure 300 as intersected by plane A-A', in accordance with some embodiments. IC structure 300 relates to each of memory macro 100 of FIG. 1 and memory macro 600 of FIG. 6. In some embodiments, IC structure 300 is bit line segment 140 or bit line bar segment 142 of a single memory cell or a single strap cell in memory macro 100 of FIG. 1. In some embodiments, IC structure 300 is two adjacent bit line segments (140[1], . . . , 140[M]) of two corresponding adjacent memory cells in memory macro 600 of FIG. 6. In some embodiments, IC structure 300 is two adjacent bit line bar segments (142[1], . . . , 142[M]) of two corresponding adjacent memory cells in memory macro 600 of FIG. 6.

Figure 7:
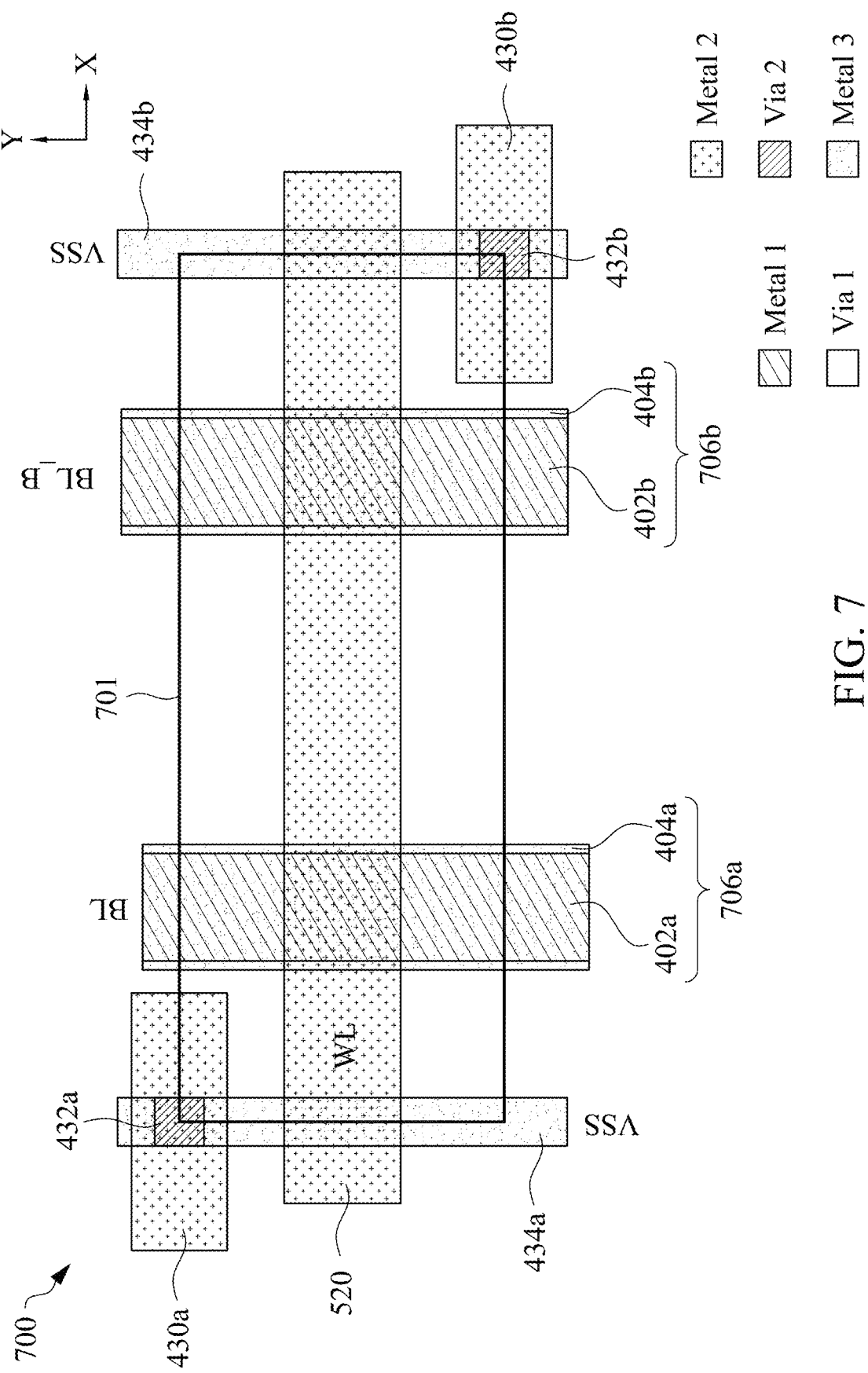
FIG. 7 is a diagram of a layout design of an IC structure, in accordance with some embodiments.

IC structure 300 is manufactured in accordance with layout design 400 (FIG. 4), layout design 500 (FIG. 5) or layout design 700 (FIG. 7).

IC structure 300 includes a first conductor 302 extending in the first direction Y and being in a first conductive layer.

In some embodiments, the first conductive layer is a metal one (M1) layer of IC structure 300. In some embodiments, the first conductor 302 comprises conductive segments 302a, 302b (collectively referred to as a "first set of conductive segments") extending in the first direction Y. The conductive segments 302a and 302b contact each other at a gridline 320. In some embodiments, if IC structure 300 is bit line segment 140 or bit line bar segment 142 of a single memory cell or a single strap cell in memory macro 100 of FIG. 1, then the gridline 320 is a midpoint of the single memory cell or the single strap cell in memory macro 100 of FIG. 1. In some embodiments, if IC structure 300 is two adjacent bit line segments (140[1], . . . , 140[M]) or bit line bar segments (142[1], . . . , 142[M]) of two corresponding adjacent memory cells in memory macro 600 of FIG. 6, then the gridline 320 is a cell boundary of the two adjacent memory cells in memory macro 600 of FIG. 6. Other quantities of segments or configurations of the first set of conductive segments are within the scope of the present disclosure. Other metal layers of the first set of conductive segments are within the scope of the present disclosure. In some embodiments, the first conductive layer is a metal layer different from the M1 layer.

IC structure 300 further includes a second conductor 304 extending in the first direction Y and being in a second conductive layer different from the first conductive layer. The second conductive layer is above the first conductive layer of IC structure 300. In some embodiments, the second conductive layer is a metal three (M3) layer of IC structure 300. In some embodiments, the second conductor 304 comprises conductive segments 304a, 304b (collectively referred to as a "second set of conductive segments") extending in the first direction Y. The conductive segments 304a and 304b contact each other at gridline 320. Other quantities of segments or configurations of the second set of conductive segments are within the scope of the present disclosure. Other metal layers of the second set of conductive segments are within the scope of the present disclosure. In some embodiments, the second conductive layer is a metal layer different from the M3 layer.

In some embodiments, first conductor 302 and second conductor 304 together correspond to bit line BL or bit line bar BLB of FIG. 1. In some embodiments, first conductor 302 and second conductor 304 correspond to bit line segment 140 or bit line bar segment 142 of FIG. 1 or FIG. 6. First conductor 302 second conductor 304 together form a bit line segment 306. In some embodiments, IC structure 300 is two adjacent bit line segments (140[1], . . . , 140[M]) of two corresponding adjacent cells in memory macro 600 of FIG. 6.

IC structure 300 further includes a third conductor 312 extending in a second direction different from the first direction, and being in a third conductive layer different from the first conductive layer and the second conductive layer. In some embodiments, the third conductive layer is a metal two (M2) layer of IC structure 300. The third conductive layer is above the first conductive layer and below the second conductive layer of IC structure 300. The third conductor 312 overlaps the first conductor 302. The second conductor 304 overlaps the third conductor 312. Other configurations of the third conductor 312 are within the scope of the present disclosure. Other metal layers are within the scope of the present disclosure. In some embodiments, the third conductive layer is a metal layer different from the M2 layer.

In some embodiments, the first conductor 302, the second conductor 304 or the third conductor 312 is a conductive material including copper, aluminum, alloys thereof or other suitable conductive materials, that is formed in one or more metallization layers by one or more of a physical vapor deposition process, a chemical vapor deposition process, a plating process, or other suitable processes.

In some embodiments, each of the conductive segments 302a, 302b, 304a, 304b of IC structure 300 located in M1 or M3 extend in the same direction. In some embodiments, each of the conductive structures (e.g., third conductor 312) of IC structure 300 located in M1 extend in the same direction.

IC structure 300 further includes a first via 310 above the first conductor 302 and below the third conductor 312. The first via 310 electrically couples the first conductor 302 to the third conductor 312. In some embodiments, first via 310 is above segment 302a of the first set of conductive segments and below the third conductor 312. In some embodiments, first via 310 electrically couples segment 302a of the first set of conductive segments to the third conductor 312. In some embodiments, first via 310 is positioned where segment 302a of the first set of conductive segments is overlapped by the third conductor 312. In some embodiments, first via 310 includes a plurality of conductive segments coupled to each other. First via 310 is on a V1 level of IC structure 300. In some embodiments, first via 310 is on a level different from the V1 level. The V1 level of IC structure 300 is above the first conductive layer and below the third conductive layer of IC structure 300. Other quantities of segments or configurations of the first via 310 are within the scope of the present disclosure.

IC structure 300 further includes a second via 314 above third conductor 312 and below second conductor 304. Second via 314 electrically couples third conductor 312 to second conductor 304. In some embodiments, second via 314 is above third conductor 312 and below segment 304a of the second set of conductive segments. In some embodiments, second via 314 electrically couples segment 304a of the second set of conductive segments to the third conductor 312. In some embodiments, second via 314 is positioned where segment 304a of the second set of conductive segments overlaps the third conductor 312. In some embodiments, second via 314 includes a plurality of conductive segments coupled to each other. Second via 314 is on a V2 level of IC structure 300. In some embodiments, second via 314 is on a level different from the V2 level. The V2 level of IC structure 300 is above the third conductive layer and below the second conductive layer of IC structure 300. Other quantities of segments or configurations of the second via 314 are within the scope of the present disclosure.

In some embodiments, IC structure 300 is divided into a first portion 330 (shown in FIG. 3B) and a second portion 340 (shown in FIG. 3B). The first portion 330 includes conductive segment 302a, conductive segment 304a, first via 310, second via 314 and third conductor 312. The second portion 340 includes conductive segment 302b and conductive segment 304b. The first portion 330 contacts the second portion at gridline 320.

In some embodiments, if IC structure 300 is bit line segment 140 or bit line bar segment 142 of a single memory cell or a single strap cell in memory macro 100 of FIG. 1, then first portion 330 and second portion 340 are both part of the single memory cell or the single strap cell in memory macro 100 of FIG. 1, and the gridline 320 is a midpoint of the single memory cell or the single strap cell in memory macro 100 of FIG. 1.

In some embodiments, if IC structure 300 is two adjacent bit line segments (140[1], . . . , 140[M]) or bit line bar segments (142[1], . . . , 142[M]) of two corresponding adjacent memory cells in memory macro 600 of FIG. 6, then first portion 330 is a first memory cell in memory macro 600 of FIG. 6 and the second portion 340 is a second memory cell in memory macro 600 of FIG. 6, and gridline 320 is the cell boundary of the first and second adjacent memory cells in memory macro 600 of FIG. 6.

In some embodiments, a center of the first via 310 is aligned in the first direction Y and the second direction X with a center of the second via 314.

In some embodiments, at least one via of the first via 310 or the second via 314 is a metal line, a via, a through silicon via (TSV), an inter-level via (ILV), a slot via, an array of vias, or another suitable conductive line. In some embodiments, at least one via of the first via 310 or the second via 314 includes copper, aluminum, nickel, titanium, tungsten, cobalt, carbon, alloys thereof or another suitable conductive material, that is formed in one or more metallization layers by one or more of a physical vapor deposition process, a chemical vapor deposition process, a plating process, or other suitable processes. In some embodiments, at least one via of the first via 310 or the second via 314 includes one or more conductive line segments. Other configurations, materials or quantities of the first via 310 or second via 314 are within the scope of the present disclosure.

In some embodiments, IC structure 300 is bit line segment 140 or bit line bar segment 142 of a single strap cell of the first set of strap cells 110, second set of strap cells 112 or third set of strap cells 114 in memory macro 100 of FIG. 1. For example, in these embodiments, first conductor 302 and second conductor 304 are electrically coupled to each other in a strap cell of the set of strap cells (e.g., first set of strap cells 110, second set of strap cells 112 or third set of strap cells 114).

In some embodiments, IC structure 300 is bit line segment 140 or bit line bar segment 142 of a single memory cell of the first memory cell array 104 or the second memory cell array 106 in memory macro 100 of FIG. 1. For example, in these embodiments, first conductor 302 is electrically coupled to second conductor 304 in a memory cell of the set of memory cells (e.g., first memory cell array 104 or second memory cell array 106).

In some embodiments, IC structure 300 is two adjacent bit line segments (140[1], . . . , 140[M]) or bit line bar segments (142[1], . . . , 142[M]) of a first cell (e.g., Cell A, FIG. 6) and an adjacent second cell (e.g., Cell B, FIG. 6) in memory macro 600 of FIG. 6. For example, in these embodiments, conductive segment 302a of the first conductor 302 and conductive segment 304a of the second conductor 304 are electrically coupled to each other within the second cell (e.g., Cell B) of the array of cells 602. For example, in these embodiments, conductive segment 302b of the first conductor 302 and conductive segment 304b of the second conductor 304 are not electrically coupled to each other within the first cell (e.g., Cell A) of the array of cells 602.

In some embodiments, at least two of conductive segments 302a, 302b, 304a and 304b have a same width (not shown) in the second direction X. In some embodiments, at least two of conductive segments 302a, 302b, 304a and 304b have a different width (not shown) in the second direction X.

In some embodiments, at least two of conductive segments 302a, 302b, 304a and 304b have a same length (not shown) in the first direction Y. In some embodiments, at least two of conductive segments 302a, 302b, 304a and 304b have a different length (not shown) in the first direction Y.

In some embodiments, at least two of conductive segments 302a, 302b, 304a and 304b have a same height (not shown) in a third direction Z. In some embodiments, at least two of conductive segments 302a, 302b, 304a and 304b have a different height (not shown) in the third direction Z.

In some embodiments, the first conductor 302 and the second conductor 304 form a bit line BL or a bit line bar BLB. In some embodiments, by using a bit line BL or a bit line bar BLB on multiple conductive layers, the resistance of the bit line BL or the bit line bar BLB of IC structure 300 is reduced compared with other approaches. In some embodiments, by reducing the resistance of the bit line BL or a bit line bar BLB, a length of the bit line BL or bit line bar BLB of IC structure 300 is longer than other approaches, resulting in a larger array of memory cells than other approaches.

Figure 4:
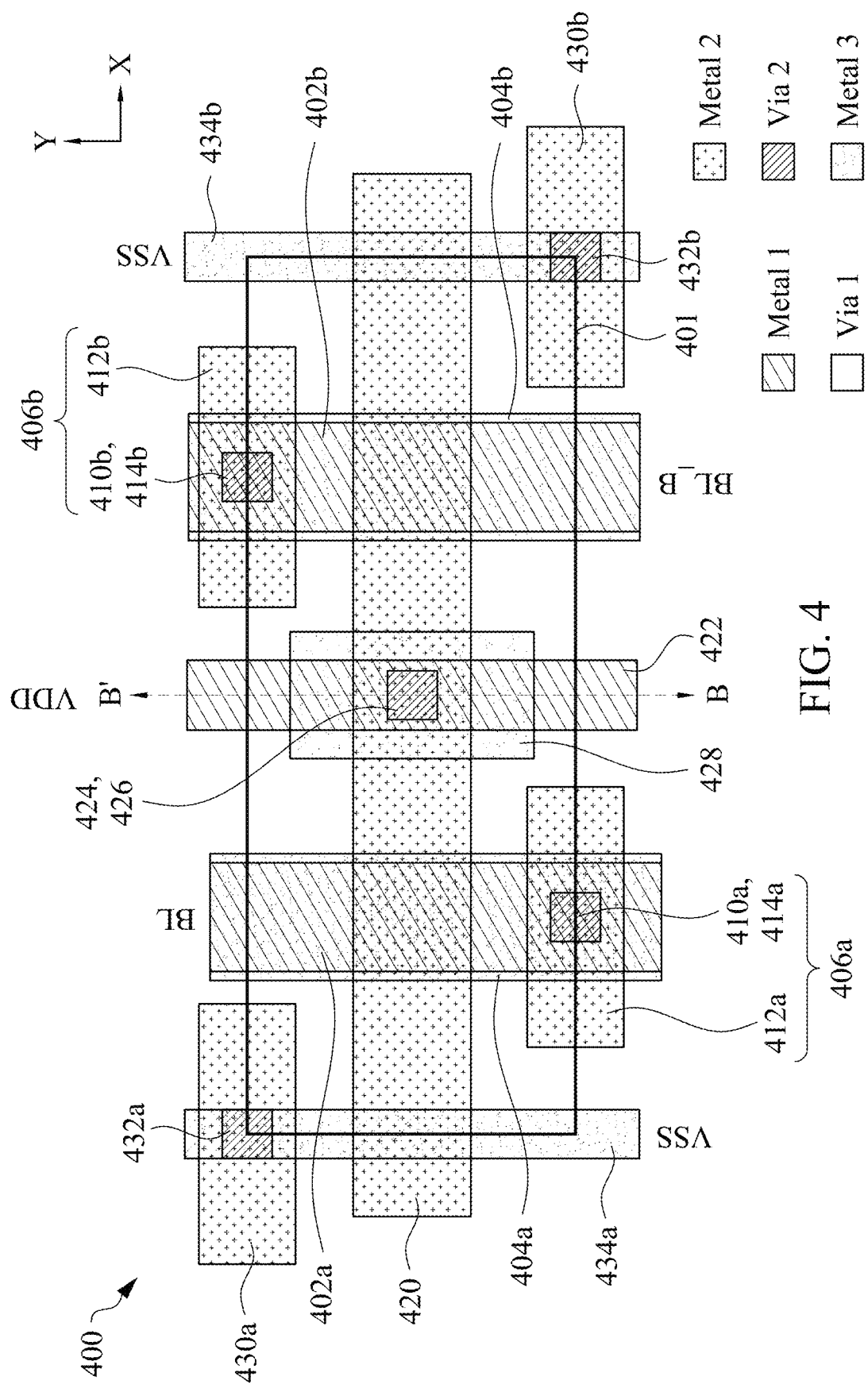
FIG. 4 is a diagram of a layout design of an IC structure, in accordance with some embodiments.

FIG. 4 is a diagram of a layout design 400 of an IC structure, in accordance with some embodiments. Components that are the same or similar to those in one or more of FIGS. 5-6 and 7 (shown below) are given the same reference numbers, and detailed description thereof is thus omitted.

Figure 5:
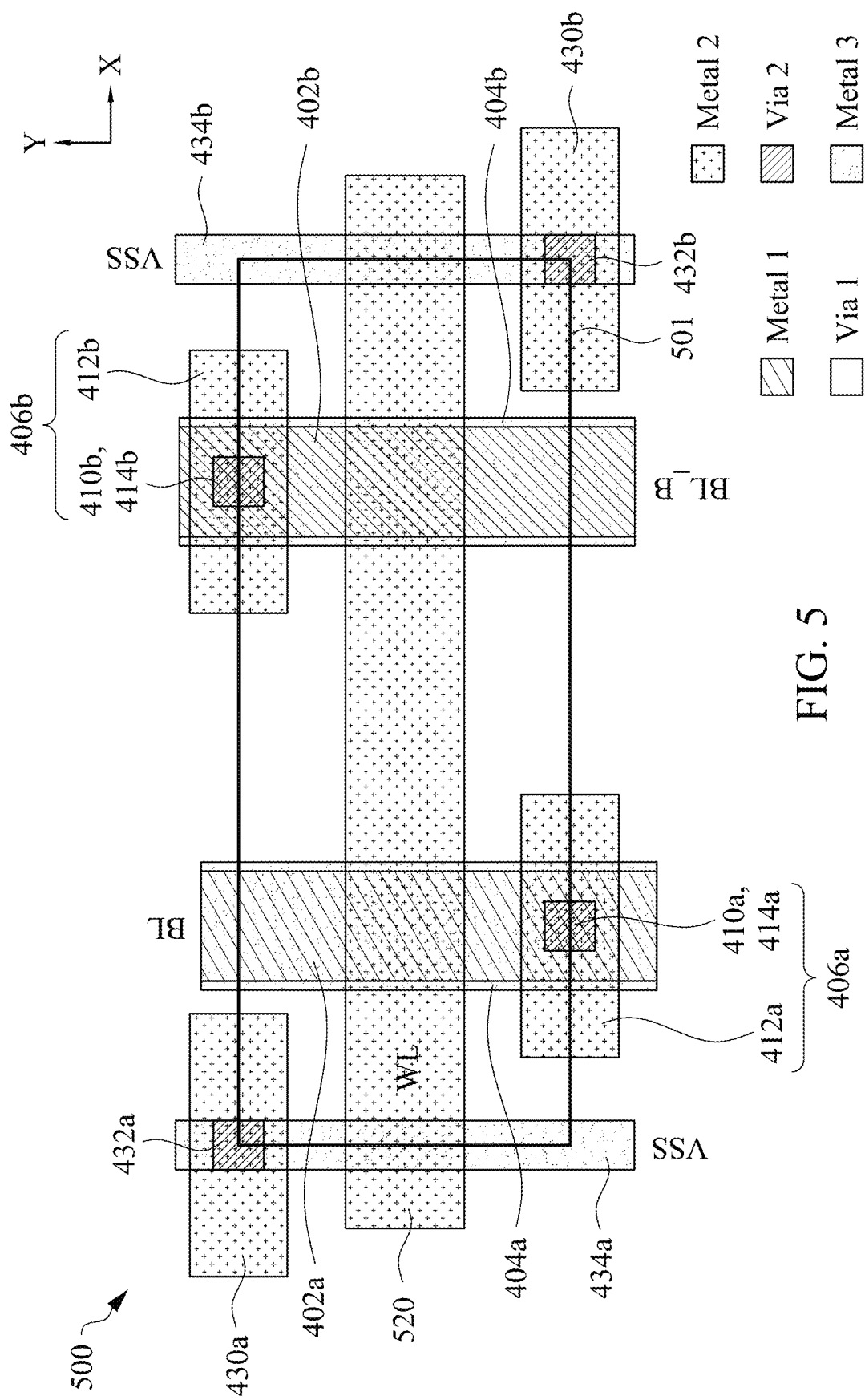
FIG. 5 is a diagram of a layout design of an IC structure, in accordance with some embodiments.

Structural relationships including alignment, lengths and widths, as well as configurations of layout design 400, layout design 500 (FIG. 5) or layout design 700 (FIG. 7) are similar to the structural relationships and configurations of IC structure 300 of FIGS. 3A-3B, and will not be described in FIGS. 4-5 and 7 for brevity.

Layout design 400 corresponds to a layout design of a strap cell of the first set of strap cells 110, the second set of strap cells 112 or the third set of strap cells 114 of memory macro 100 of FIG. 1.

Layout design 400 includes a cell 401, a bit line layout pattern 406a and a bit line bar layout pattern 406b. Cell 401 is a cell boundary of layout design 400. In some embodiments, cell 401 is a boundary of a layout design of one or more strap cells of the first set of strap cells 110, the second set of strap cells 112 or the third set of strap cells 114 of memory macro 100 of FIG. 1.

In some embodiments, the bit line layout pattern 406a is usable to manufacture a corresponding bit line segment 140 (FIG. 1) of memory macro 100 or IC structure 300. In some embodiments, the bit line bar layout pattern 406a is usable to manufacture a corresponding bit line bar segment 142 (FIG. 1) of memory macro 100 or IC structure 300.

Each of bit line layout pattern 406a and bit line bar layout pattern 406b extend in the first direction Y and overlaps cell 401.

Bit line layout pattern 406a is separated from bit line bar layout pattern 406b in the second direction X.

Bit line layout pattern 406a comprises conductive feature layout patterns 402a, 404a and 412a, and via layout patterns 410a and 414a.

Bit line bar layout pattern 406b comprises conductive feature layout patterns 402b, 404b and 412b, and via layout patterns 410b and 414b.

Each of conductive feature layout patterns 402a and 402b extend in the first direction Y, and are separated from each other in the second direction X. Each of conductive feature layout patterns 402a and 402b overlap cell 401 and a conductive feature layout pattern 420. Conductive feature layout pattern 402a or 402b is usable to manufacture conductive segment 302a or 302b (shown in FIGS. 3A-3B) of IC structure 300. Conductive feature layout patterns 402a and 402b are on a first layout level of layout design 400. In some embodiments, conductive feature layout pattern 402a or 402b are on a layout level different from the first layout level. In some embodiments, the first layout level is the metal one (M1) layer. Other configurations or quantities of conductive feature layout patterns 402a and 402b are within the scope of the present disclosure. Other configurations of metal layers are within the scope of the present disclosure. In some embodiments, the first layout level is a metal layer different from the M1 layer.

Each of conductive feature layout patterns 404a and 404b extend in the first direction Y, and are separated from each other in the second direction X. Each of conductive feature layout patterns 404a and 404b overlap cell 401 and a conductive feature layout pattern 420. Conductive feature layout pattern 404a or 404b is usable to manufacture conductive segment 304a or 304b (shown in FIGS. 3A-3B) of IC structure 300. Conductive feature layout patterns 404a and 404b are on a second layout level of layout design 400. In some embodiments, conductive feature layout pattern 404a or 404b are on a layout level different from the second layout level. In some embodiments, the second layout level is the metal three (M3) layer. Conductive feature layout pattern 404a, 404b is over corresponding conductive feature layout pattern 402a, 402b. In some embodiments, conductive feature layout pattern 404a, 404b overlaps the corresponding conductive feature layout pattern 402a, 402b. Other configurations or quantities of conductive feature layout patterns 404a and 404b are within the scope of the present disclosure. Other configurations of metal layers are within the scope of the present disclosure. In some embodiments, the second layout level is a metal layer different from the M3 layer.

Each of conductive feature layout patterns 412a and 412b extend in the second direction X. Each of conductive feature layout patterns 412a and 412b overlap a corresponding side (not labelled) of cell 401. Conductive feature layout pattern 412a or 412b is usable to manufacture third conductor 312 (shown in FIGS. 3A-3B) of IC structure 300. Conductive feature layout patterns 412a and 412b are on a third layout level of layout design 400. In some embodiments, conductive feature layout pattern 412a or 412b are on a layout level different from the third layout level. In some embodiments, the third layout level is the metal two (M2) layer. Conductive feature layout pattern 412a, 412b overlaps corresponding conductive feature layout pattern 402a, 402b. Conductive feature layout pattern 412a, 412b is overlapped by corresponding conductive feature layout pattern 404a, 404b. Other configurations or quantities of conductive feature layout patterns 412a and 412b are within the scope of the present disclosure. Other configurations of metal layers are within the scope of the present disclosure. In some embodiments, the third layout level is a metal layer different from the M2 layer.

Via layout pattern 410a or 410b is usable to manufacture a first via 310 (shown in FIGS. 3A-3B) of IC structure 300. Via layout pattern 410a, 410b is between corresponding conductive feature layout pattern 402a, 402b and corresponding conductive feature layout pattern 412a, 412b. Each via layout pattern 410a, 410b is over the corresponding conductive feature layout pattern 402a, 402b. In some embodiments, via layout pattern 410a, 410b is located where the corresponding conductive feature layout pattern 412a, 412b overlaps the corresponding conductive feature layout pattern 402a, 402b. In some embodiments, a center of one or more via layout patterns 410a, 410b is aligned with a corresponding side (not labelled) of cell 401. Via layout pattern 410a or 410b is on a layout level (V1) of layout design 400 between the first layout level and the third layout level. Other configurations of via layout pattern 410a or 410b is within the scope of the present disclosure. In some embodiments, via layout pattern 410a or 410b is on a layout level different from the V1 level.

Via layout pattern 414a or 414b is usable to manufacture a second via 314 (shown in FIGS. 3A-3B) of IC structure 300. Via layout pattern 414a, 414b is between corresponding conductive feature layout pattern 404a, 404b and corresponding conductive feature layout pattern 412a, 412b. Each via layout pattern 414a, 414b is over the corresponding conductive feature layout pattern 412a, 412b. In some embodiments, via layout pattern 414a, 414b is located where the corresponding conductive feature layout pattern 404a, 404b overlaps the corresponding conductive feature layout pattern 412a, 412b. In some embodiments, a center of one or more via layout patterns 414a, 414b is aligned with a side of cell 401. In some embodiments, a center of via layout pattern 414a, 414b is aligned with a center of corresponding via layout pattern 410a, 410b. Via layout pattern 414a or 414b is on a layout level (V2) of layout design 400 between the second layout level and the third layout level. Other configurations of via layout pattern 414a or 414b is within the scope of the present disclosure. In some embodiments, via layout pattern 414a or 414b is on a layout level different from the V2 level.

Layout design 400 further includes a conductive feature layout pattern 420, a conductive feature layout pattern 422, a conductive feature layout pattern 428 and via layout patterns 424 and 426.

Conductive feature layout pattern 420 extends in the second direction X. Conductive feature layout pattern 420 overlaps cell 401. Conductive feature layout pattern 420 is usable to manufacture a fourth conductor (not shown) similar to a word line of IC structure 300. Conductive feature layout pattern 420 is on the third layout level of layout design 400. In some embodiments, conductive feature layout pattern 420 is on a layout level different from the third layout level. Other configurations or quantities of conductive feature layout pattern 420 is within the scope of the present disclosure.

Conductive feature layout pattern 422 extends in the first direction Y. Conductive feature layout pattern 422 overlaps cell 401 and conductive feature layout pattern 420. Conductive feature layout pattern 422 is usable to manufacture a fifth conductor (not shown) of IC structure 300. Conductive feature layout pattern 422 is on the first layout level of layout design 400. In some embodiments, conductive feature layout pattern 422 is on a layout level different from the first layout level. Other configurations or quantities of conductive feature layout pattern 422 is within the scope of the present disclosure.

Conductive feature layout pattern 428 extends in the first direction Y. Conductive feature layout pattern 428 overlaps cell 401, conductive feature layout pattern 420 and conductive feature layout pattern 422. Conductive feature layout pattern 428 is usable to manufacture a sixth conductor (not shown) of IC structure 300. Conductive feature layout pattern 428 is on the second layout level of layout design 400. In some embodiments, conductive feature layout pattern 428 is on a layout level different from the second layout level. Other configurations or quantities of conductive feature layout pattern 428 is within the scope of the present disclosure.

Via layout pattern 424 is usable to manufacture a third via (not shown) of IC structure 300. Via layout pattern 424 is between conductive feature layout pattern 420 and conductive feature layout pattern 422. Via layout pattern 424 is over conductive feature layout pattern 420. In some embodiments, via layout pattern 424 is located where the conductive feature layout pattern 422 overlaps conductive feature layout pattern 420. In some embodiments, a center of via layout pattern 424 is aligned with a center of cell 401. Via layout pattern 424 is on the layout level (V1) of layout design 400 between the first layout level and the third layout level. Other configurations of via layout pattern 424 is within the scope of the present disclosure. In some embodiments, via layout pattern 424 is on a layout level different from the V1 level.

Via layout pattern 426 is usable to manufacture a fourth via (not shown) of IC structure 300. Via layout pattern 426 is between conductive feature layout pattern 428 and conductive feature layout pattern 422. Via layout pattern 426 is over conductive feature layout pattern 422. In some embodiments, via layout pattern 426 is located where the conductive feature layout pattern 428 overlaps conductive feature layout pattern 422. In some embodiments, a center of via layout pattern 426 is aligned with at least a center of cell 401 or a center of via layout pattern 424. Via layout pattern 426 is on the layout level (V2) of layout design 400 between the second layout level and the third layout level. Other configurations of via layout pattern 426 is within the scope of the present disclosure. In some embodiments, via layout pattern 426 is on a layout level different from the V2 level.

Layout design 400 further includes conductive feature layout patterns 430a, 430b, 434a, 434b and via layout patterns 432a, 432b.

Each of conductive feature layout patterns 430a and 430b extend in the second direction X. Each of conductive feature layout patterns 430a and 430b overlap cell 401. In some embodiments, conductive feature layout pattern 430a overlaps a first corner (not labeled) of cell 401 and conductive feature layout pattern 430b overlaps a second corner (not labeled) of cell 401. Conductive feature layout pattern 430a or 430b is usable to manufacture a conductive segment (not shown) of IC structure 300. Conductive feature layout patterns 430a and 430b are on the second layout level of layout design 400. In some embodiments, conductive feature layout pattern 430a or 430b is on a layout level different from the second layout level. Other configurations or quantities of conductive feature layout patterns 430a and 430b are within the scope of the present disclosure.

Each of conductive feature layout patterns 434a and 434b extend in the first direction Y, and are separated from each other in the second direction X. Each of conductive feature layout patterns 434a and 434b overlap cell 401 and a conductive feature layout pattern 420. Conductive feature layout pattern 434a, 434b overlaps corresponding conductive feature layout pattern 430a, 430b. Conductive feature layout pattern 434a or 434b is usable to manufacture a conductive segment (not shown) of IC structure 300. Conductive feature layout patterns 434a and 434b are on the second layout level of layout design 400. In some embodiments, conductive feature layout pattern 434a or 434b is on a layout level different from the second layout level. Conductive feature layout pattern 434a, 434b is over corresponding conductive feature layout pattern 430a, 430b. In some embodiments, conductive feature layout pattern 434a, 434b overlaps the corresponding conductive feature layout pattern 430a, 430b. Other configurations or quantities of conductive feature layout patterns 434a and 434b are within the scope of the present disclosure.

Via layout pattern 432a or 432b is usable to manufacture a fifth via (not shown) of IC structure 300. Via layout pattern 432a, 432b is between corresponding conductive feature layout pattern 434a, 434b and corresponding conductive feature layout pattern 430a, 430b. Each via layout pattern 432a, 432b is over corresponding conductive feature layout pattern 430a, 430b. In some embodiments, via layout pattern 432a, 432b is located where the corresponding conductive feature layout pattern 434a, 434b overlaps the corresponding conductive feature layout pattern 430a, 430b. In some embodiments, a center of one or more via layout patterns 432a, 432b is aligned with a corner of cell 401. Via layout pattern 432a or 432b is on the layout level (V2) of layout design 400 between the second layout level and the third layout level. Other configurations of via layout pattern 432a or 432b is within the scope of the present disclosure. In some embodiments, via layout pattern 432a or 432b is on a layout level different from the V2 level.

In some embodiments, conductive feature layout pattern 420, 422 and 428 and via layout patterns 424 and 426 are usable to manufacture a conductive structure (not shown) that is coupled to a first supply voltage VDD and an N-well or a P-well region of a transistor in cell 401.

In some embodiments, conductive feature layout pattern 430a, 430b, via layout pattern 432a, 432b, conductive feature layout pattern 434a, 434b are usable to manufacture a conductive structure (not shown) that is coupled to a second supply voltage VSS and N-well or a P-well region of a transistor in strap cell. The second supply voltage VSS different from the first supply voltage VDD.

Details regarding the layout design of one or more transistors in layout design 400-500 or 700 are found, e.g., in U.S. application Ser. No. 15/186,446, filed Jun. 18, 2016, the entirety of which is hereby incorporated by reference. In some embodiments, by using bit line layout pattern 406a and bit line bar layout pattern 406b of layout design 400-500 to manufacture corresponding bit line BL and bit line bar BLB on multiple conductive layers, the resistance of the bit line BL or a bit line bar BLB of memory array 100 or 600 is reduced compared with other approaches. In some embodiments, by reducing the resistance of the bit line BL or a bit line bar BLB, a length of the bit line BL or bit line bar BLB of memory array 100 or 600 is longer than other approaches, resulting in a larger array of memory cells than other approaches.

FIG. 5 is a diagram of a layout design 500 of an IC structure, in accordance with some embodiments.

Layout design 500 is a variation of layout design 400 of FIG. 4. In comparison with layout design 400 of FIG. 4, layout design 500 does not include conductive feature layout patterns 422 and 428, and via layout patterns 424 and 426.

In comparison with layout design 400 of FIG. 4, conductive feature layout 520 of layout design 500 replaces conductive feature layout pattern 420, and cell 501 replaces cell 401. Cell 501 corresponds to a cell boundary of layout design 500.

Conductive feature layout pattern 520 extends in the second direction X. Conductive feature layout pattern 520 overlaps cell 501. Conductive feature layout pattern 520 is usable to manufacture a word line portion (e.g., word line WL in FIG. 2) of memory cell 200. Conductive feature layout pattern 520 is on the third layout level of layout design 500. In some embodiments, conductive feature layout pattern 520 is on a layout level different from the third layout level. Other configurations or quantities of conductive feature layout pattern 520 is within the scope of the present disclosure.

Layout design 500 is usable with each of memory macro 100 of FIG. 1 and memory macro 600 of FIG. 6. In some embodiments, layout design 500 corresponds to a layout design of one or more memory cells (labelled as "Cell" in FIG. 1) in the first memory cell array 104 of FIG. 1 or second memory cell array 106 of FIG. 1 or a layout design of memory cell 200 of FIG. 2. In some embodiments, if layout design 500 corresponds to a layout design of one or more memory cells (labelled as "Cell") in FIG. 1, then layout design 500 is usable to manufacture the first portion 330 and the second portion 340 of IC structure 300 of FIGS. 3A-3B. In some embodiments, layout design 500 corresponds to a layout design of a memory cell (labelled as "Cell B" in FIG. 6) in array of cells 602 (FIG. 6). In some embodiments, if layout design 500 corresponds to a layout design of one or more second memory cells (labelled as "Cell B") in FIG. 6, then layout design 500 is usable to manufacture the first portion 330 of IC structure 300 of FIGS. 3A-3B.

FIG. 6 is a circuit diagram of a memory macro 600, in accordance with some embodiments. In the embodiment of FIG. 6, memory macro 600 is an SRAM macro. SRAM is used for illustration, and other types of memories are within the scope of various embodiments.

Memory macro 600 is a variation of memory macro 100 of FIG. 1. In comparison with memory macro 100 of FIG. 1, array of cells 602 of memory macro 600 replaces array of cells 102 of FIG. 1.

Array of cells 602 is an array of memory cells (e.g., CELL-A OR CELL-B) having M rows and N columns. The columns of cells in array of cells 602 are arranged in the first direction Y. The rows of cells in array of cells 602 are arranged in the second direction X.

In some embodiments, at least one memory cell in array of cells 602 includes one or more single port (SP) SRAM cells. In some embodiments, at least one memory cell in array of cells 602 includes one or more dual port (DP) SRAM cells. Different types of memory cells in array of cells 602 are within the contemplated scope of the present disclosure.

Each column in array of cells 602 has one or more first memory cells (CELL-A) interspersed with one or more second memory cells (CELL-B). In some embodiments, in each column, a second memory cell (CELL-B) is repeated in the second direction Y by Y1 cells. In some embodiments, Y1 ranges from 3 to 15. For example, in some embodiments, each second memory cell (CELL-B) is separated from another second memory cell (CELL_B) in a same column by 3 to 15 rows of first memory cells (CELL-A). Due to the arrangement or size of memory macro 600, columns 3, . . . , N show a single second memory cell (CELL-B), but columns 3, . . . , N each include one or more additional second memory cells (CELL-B) that are not shown. Other configurations of array of cells 602 is within the scope of the present disclosure.

Each row in array of cells 602 has one or more first memory cells (CELL-A) interspersed with one or more second memory cells (CELL-B).

First memory cells (CELL-A) or second memory cells (CELL-B) correspond to memory cell 200 of FIG. 2.

Memory macro 600 can be utilized in combination with layout design 500 of FIG. 5 and layout design 700 of FIG. 7. In some embodiments, layout design 500 is usable by system 900 to manufacture the second memory cells (Cell-B). In some embodiments, layout design 700 is usable by system 900 to manufacture the first memory cells (Cell-A).

In some embodiments, one or more second memory cells CELL-B of array 602 corresponds to first portion 330 of IC structure 300. For example, in some embodiments, one or more second memory cells CELL-B of array 602 includes conductive segments 302a and 304a, third conductor 312, first via 310 and second via 314 of IC structure 300. In some embodiments, conductive segment 302a of FIGS. 3A-3B is coupled to conductive segment 304a of FIGS. 3A-3B in each of the second memory cells CELL-B of array 602. Other configurations of second memory cells CELL-B is within the scope of the present disclosure. For example, in some embodiments, the number of second memory cells CELL-B in array of cells 602 is increased. In some embodiments, by increasing the number of second memory cells CELL-B in array 602, the number of electrical connections between conductive segment 302a and conductive segment 304a is increased causing the bit line BL or bit line bar BLB to have a lower resistance than other approaches.

In some embodiments, one or more first memory cells CELL-A of array 602 corresponds to second portion 340 of IC structure 300. For example, in some embodiments, one or more first memory cells CELL-A of array 602 includes conductive segments 302b and 304b of IC structure 300. In some embodiments, in one or more first memory cells CELL-A of array 602, the conductive segment 302b is not coupled to the conductive segment 304b of FIGS. 3A-3B. Other configurations of first memory cells CELL-A is within the scope of the present disclosure. For example, in some embodiments, the number of first memory cells CELL-A in array of cells 602 is increased causing less conductive structures 312 to be utilized within each first memory cell CELL-A. In some embodiments, by using less conductive structures 312 within each first memory cell CELL-A, the region formerly occupied by the conductive structures 312 can be used by wider word lines WL resulting in a lower word line WL resistance than other approaches.

In some embodiment, each of the second memory cells CELL-B in a same column are separated from each other by a distance Y1. For example, column 1 of array of cells 602 includes a cell 610, a cell 612 and a memory cell array 614. Cell 610 and cell 612 are each second memory cells CELL-B. For ease of illustration, each of the first memory cells CELL_A between a pair of second memory cells in a same column are another memory cell array, but are not labelled as a memory cell array in FIG. 6 for simplicity.

In some embodiments, memory cell array 614 includes an array of first memory cells CELL-A including Y1 rows by N columns, where Y1 is a positive integer corresponding to the number of rows in memory cell array 614. In some embodiments, Y1 ranges from 3 to 15.

FIG. 7 is a diagram of a layout design 700 of an IC structure, in accordance with some embodiments.

Layout design 700 is usable to manufacture one or more first memory cells Cell-A of memory macro 600 in FIG. 6.

Layout design 700 is a variation of layout design 500 of FIG. 5. In comparison with layout design 500 of FIG. 5, layout design 700 does not include via layout patterns 410a, 410b, 414a and 414b, and conductive feature layout patterns 412a and 412b.

Cell 701 of layout design 700 replaces cell 501 of layout design 500. Cell 701 corresponds to a cell boundary of layout design 700.

Layout design 700 corresponds to a layout design of one or more memory cells (labelled as "Cell-A" in FIG. 6) in memory cell array 604 (FIG. 6). In some embodiments, layout design 700 is usable to manufacture the second portion 340 of IC structure 300 of FIGS. 3A-3B.

Layout design 700 does not include via layout patterns 410a, 410b, 414a and 414b, and conductive feature layout patterns 412a and 412b, therefore conductive feature layout patterns (e.g., 302b and 304b) of the bit line (BL) or bit line bar BLB manufactured by layout design 700 are not coupled to each other within cell 701. In some embodiments, conductive feature layout pattern 302b of FIGS. 3A-3B is not electrically coupled to 304b of FIGS. 3A-3B. In some embodiments, by using bit line layout pattern 706a and bit line bar layout pattern 706b of layout design 700 to manufacture bit line BL and bit line bar BLB on multiple conductive layers, the resistance of the bit line BL or a bit line bar BLB of memory array 600 is reduced compared with other approaches. In some embodiments, by reducing the resistance of the bit line BL or a bit line bar BLB, a length of the bit line BL or bit line bar BLB of memory array 600 is longer than other approaches, resulting in a larger array of memory cells than other approaches.

Figure 8A:
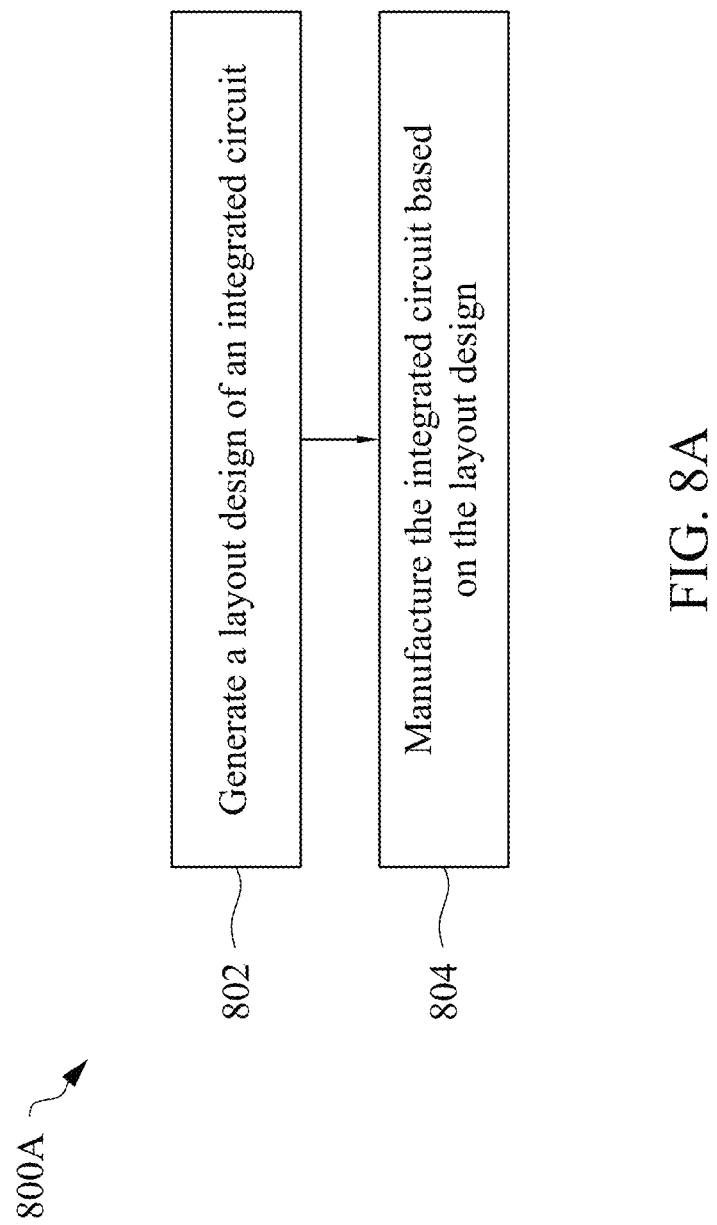
FIG. 8A is a flowchart of a method of manufacturing an IC, in accordance with some embodiments.

FIG. 8A is a flowchart of a method 800A of forming or manufacturing an IC in accordance with some embodiments. It is understood that additional operations may be performed before, during, and/or after the method 800A depicted in FIG. 8A, and that some other processes may only be briefly described herein. In some embodiments, the method 800A is usable to form integrated circuits, such as memory macro 100 (FIG. 1), memory cell 200 (FIG. 2), IC structure 300 (FIGS. 3A-3B) or memory macro 600 (FIG. 6). In some embodiments, the method 800 is usable to form integrated circuits having similar structural relationships as one or more of layout designs 400-500 or 700 (FIG. 4-5 or 7).

In operation 802 of method 800A, a layout design 400, 500, or 700 of a memory array circuit (e.g., memory macro 100, 600) is generated. Operation 802 is performed by a processing device (e.g., processor 902 (FIG. 9)) configured to execute instructions for generating a layout design 400, 500 or 700. In some embodiments, the layout design 400, 500 or 700 is a graphic database system (GDSII) file format.

In operation 804 of method 800A, the memory array circuit (e.g., memory macro 100, 600) is manufactured based on layout design 400, 500 or 700. In some embodiments, the memory array circuit of operation 802 or 804 comprises memory cell 200 (FIG. 2) or IC structure 300 (FIGS. 3A-3B). In some embodiments, operation 804 of method 800A comprises manufacturing at least one mask based on the layout design 400, 500 or 700, and manufacturing the memory array circuit (e.g., memory macro 100, 600) based on the at least one mask.

Figure 8B:
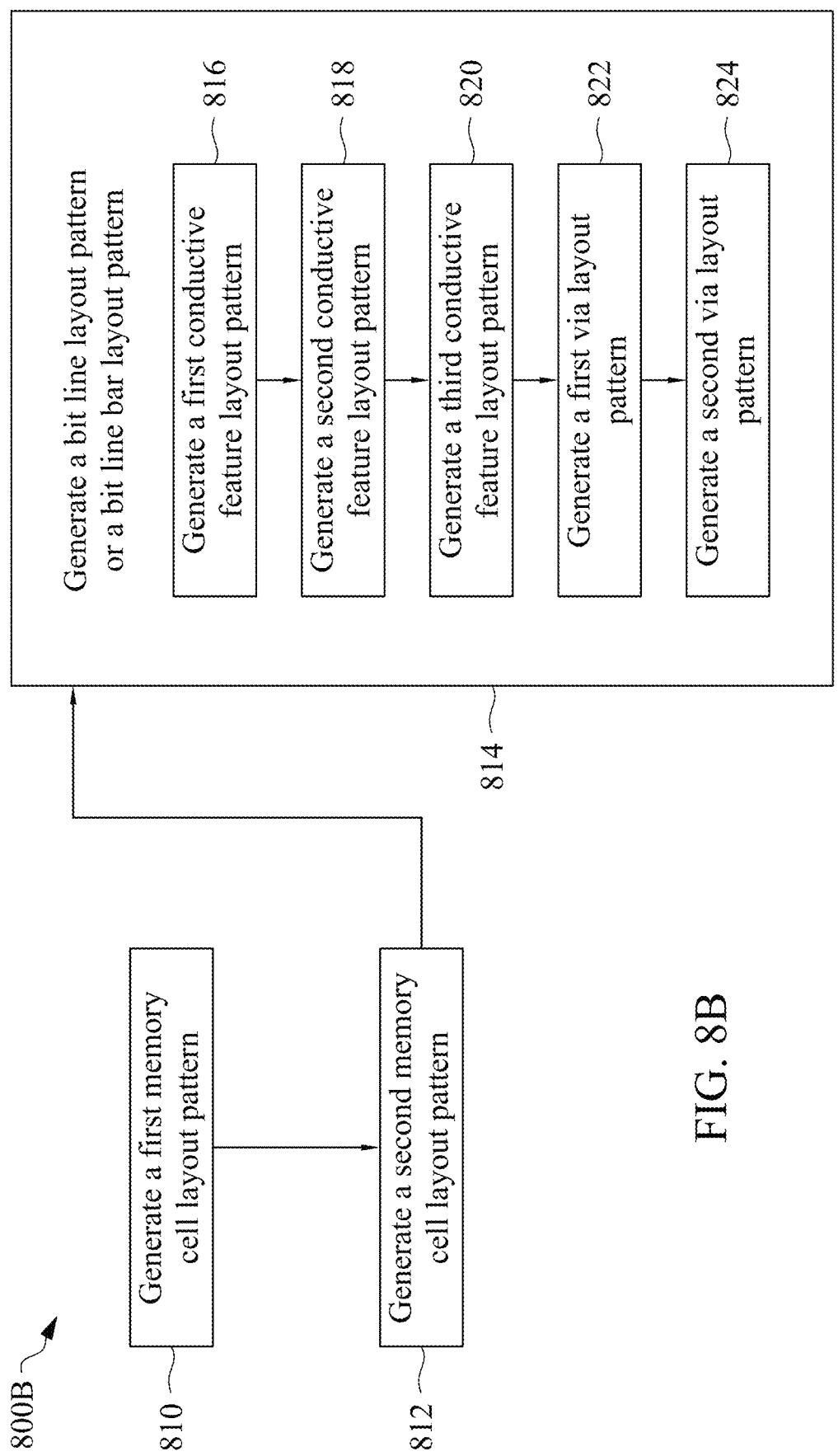
FIG. 8B is a flowchart of a method of generating a layout design of a memory array circuit, in accordance with some embodiments.

FIG. 8B is a flowchart of a method 800B of generating a layout design of a memory array circuit in accordance with some embodiments. It is understood that additional operations may be performed before, during, and/or after the method 800B depicted in FIG. 8B, and that some other processes may only be briefly described herein. In some embodiments, the method 800B is usable to generate one or more of layout designs 400-500 or 700 (FIG. 4-5 or 7) of memory macro 100 (FIG. 1), memory cell 200 (FIG. 2), IC structure 300 (FIGS. 3A-3B) or memory macro 600 (FIG. 6).

In operation 810 of method 800B, a first memory cell layout pattern (e.g., layout design 400, 500 or 700) is generated. In some embodiments, the first memory cell layout pattern (e.g., layout design 400, 500 or 700) corresponds to fabricating a first memory cell (e.g., CELL-A, CELL-B) of the memory cell array circuit.

In some embodiments, the first memory cell of method 800A or 800B includes memory cell 200. In some embodiments, the first memory cell of method 800A or 800B includes one or more strap cells of the first set of strap cells 110, the second set of strap cells 112 or the third set of strap cells 114. In some embodiments, the first memory cell of method 800A or 800B includes one or more memory cells of the first memory cell array 104 or the second memory cell array 106. In some embodiments, the first memory cell of method 800A or 800B is configured to store data. In some embodiments, operation 810 further includes placing the first memory cell layout pattern (e.g., layout design 400, 500 or 700) into a layout level of the layout design.

In operation 812, a second memory cell layout pattern (e.g., layout design 400, 500 or 700) is generated. In some embodiments, the second memory cell layout pattern (e.g., layout design 400, 500 or 700) corresponds to fabricating a second memory cell (e.g., CELL-A, CELL-B) of the memory cell array circuit. In some embodiments, the second memory cell layout pattern is separated from the first memory cell layout pattern in the first direction Y.

In some embodiments, the second memory cell of method 800A or 800B includes memory cell 200. In some embodiments, the second memory cell of method 800A or 800B includes one or more strap cells of the first set of strap cells 110, the second set of strap cells 112 or the third set of strap cells 114. In some embodiments, the second memory cell of method 800A or 800B includes one or more memory cells of the first memory cell array 104 or the second memory cell array 106. In some embodiments, the second memory cell of method 800A or 800B is configured to store data. In some embodiments, operation 812 further includes placing the second memory cell layout pattern (e.g., layout design 400, 500 or 700) into the layout level of the layout design.

In operation 814, a bit line layout pattern 406a, 706a or a bit line bar layout pattern 406b, 706b is generated. In some embodiments, the bit line layout pattern 406a, 706a corresponds to fabricating a bit line BL of the memory array circuit. In some embodiments, the bit line bar layout pattern 406b, 706b corresponds to fabricating a bit line bar BLB of the memory array circuit. In some embodiments, the bit line layout pattern 406a, 706a or the bit line bar layout pattern 406b, 706b extends in the first direction Y. In some embodiments, operation 814 further includes placing the bit line layout pattern 406a, 706a or bit line bar layout pattern 406b, 706b into the layout design.

In some embodiments, operation 814 includes one or more of operations 816, 818, 820, 822 or 824.

In operation 816, a first conductive feature layout pattern (conductive feature layout pattern 402a, 402b) is generated. In some embodiments, the first conductive feature layout pattern (conductive feature layout pattern 402a, 402b) corresponds to fabricating a first conductive segment (conductive segment 302a, 302b) of the bit line BL or bit line bar BLB. In some embodiments, the first conductive feature layout pattern extends in the first direction Y and is on the first layout level. In some embodiments, operation 816 further includes placing the first conductive feature layout pattern 402a, 402b on the first layout level (M1). In some embodiments, the first conductive feature layout pattern of method 800A or 800B includes conductive feature layout patterns 422.

In operation 818, a second conductive feature layout pattern (conductive feature layout pattern 404a, 404b) is generated. In some embodiments, the second conductive feature layout pattern (conductive feature layout pattern 404a, 404b) corresponds to fabricating a second conductive segment (e.g., conductive segment 304a, 304b) of the bit line BL or bit line bar BLB. In some embodiments, the second conductive feature layout pattern extends in the first direction Y and is on the second layout level (M3) different from the first layout level (M1). In some embodiments, operation 816 further includes placing the second conductive feature layout pattern 404a, 404b on the second layout level. In some embodiments, the second conductive feature layout pattern of method 800A or 800B includes one or more of conductive feature layout patterns 428, 434a or 434b.

In operation 820, a third conductive feature layout pattern (e.g., conductive feature layout pattern 412a, 412b) is generated. In some embodiments, the third conductive feature layout pattern (e.g., conductive feature layout pattern 412a, 412b) corresponds to fabricating a third conductive segment (e.g., third conductor 312). In some embodiments, the third conductive feature layout pattern extends in the second direction X, and is on the third layout level (M2) different from the first layout level (M1) and the second layout level (M3). In some embodiments, operation 820 further includes placing the third conductive feature layout pattern 412a, 412b on the third layout level. In some embodiments, the third feature layout pattern of method 800A or 800B includes one or more of conductive feature layout patterns 420, 430a or 430b.

In operation 822, a first via layout pattern (e.g., via layout pattern 410a, 410b) is generated. In some embodiments, the first via layout pattern (e.g., via layout pattern 410a, 410b) corresponds to fabricating a first via 310 coupled between the first conductive segment (e.g., conductive segment 302a, 302b) of the bit line BL or bit line bar BLB and the third conductive segment (e.g., third conductor 312). In some embodiments, the first via layout pattern (e.g., via layout pattern 410a, 410b) is located where the third conductive feature layout pattern 412a, 412b overlaps the first conductive feature layout pattern (e.g., conductive feature layout pattern 402a, 402b). In some embodiments, operation 824 further includes placing the first via layout pattern between the first layout level (M1) and the third layout level (M2).

In operation 824, a second via layout pattern (e.g., via layout pattern 414a, 414b) is generated. In some embodiments, the second via layout pattern (e.g., via layout pattern 414a, 414b) corresponds to fabricating a second via 314 coupled between the second conductive segment (e.g., conductive segment 304a, 304b) of the bit line BL or bit line bar BLB and the third conductive segment (e.g., third conductor 312). In some embodiments, the second via layout pattern (e.g., via layout pattern 414a, 414b) is located where the second conductive feature layout pattern (e.g., conductive feature layout pattern 404a, 404b) overlaps the third conductive feature layout pattern (e.g., conductive feature layout pattern 412a, 412b). In some embodiments, operation 826 further includes placing the second via layout pattern between the second layout level (M2) and the third layout level (M3).

In some embodiments, one or more of layout design 400, 500 or 700 is a standard cell. In some embodiments, one or more of operations 816, 818, 820, 822 or 824 is not performed.

One or more of the operations of methods 800A-800B is performed by a processing device configured to execute instructions for manufacturing a memory array circuit, such as memory macro 100 or 600, or an IC, such as IC structure 300. In some embodiments, one or more operations of methods 800A-800B is performed using a same processing device as that used in a different one or more operations of methods 800A-800B. In some embodiments, a different processing device is used to perform one or more operations of methods 800A-800B from that used to perform a different one or more operations of methods 800A-800B.

Figure 9:
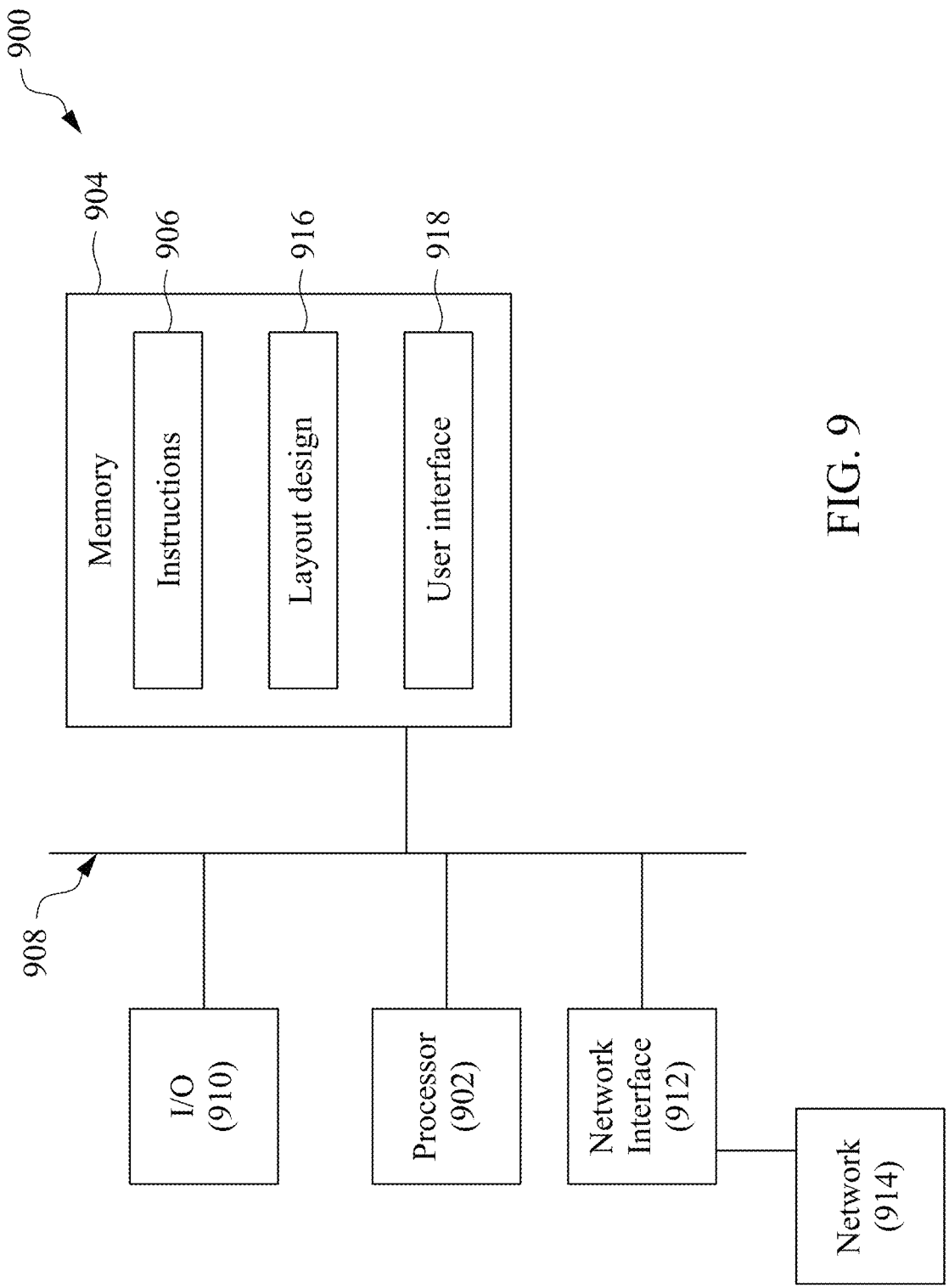
FIG. 9 is a block diagram of a system of designing an IC layout design, in accordance with some embodiments.

FIG. 9 is a schematic view of a system 900 for designing an IC layout design in accordance with some embodiments. In some embodiments, system 900 generates or places one or more IC layout designs described herein. System 900 includes a hardware processor 902 and a non-transitory, computer readable storage medium 904 encoded with, i.e., storing, the computer program code 906, i.e., a set of executable instructions. Computer readable storage medium 904 is configured for interfacing with manufacturing machines for producing the integrated circuit. The processor 902 is electrically coupled to the computer readable storage medium 904 via a bus 908. The processor 902 is also electrically coupled to an I/O interface 910 by bus 908. A network interface 912 is also electrically connected to the processor 902 via bus 908. Network interface 912 is connected to a network 914, so that processor 902 and computer readable storage medium 904 are capable of connecting to external elements via network 914. The processor 902 is configured to execute the computer program code 906 encoded in the computer readable storage medium 904 in order to cause system 900 to be usable for performing a portion or all of the operations as described in method 800A or 800B.

In some embodiments, the processor 902 is a central processing unit (CPU), a multi-processor, a distributed processing system, an application specific integrated circuit (ASIC), and/or a suitable processing unit.

In some embodiments, the computer readable storage medium 904 is an electronic, magnetic, optical, electromagnetic, infrared, and/or a semiconductor system (or apparatus or device). For example, the computer readable storage medium 904 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 904 includes a compact disk-read only memory (CD-ROM), a compact disk-read/write (CD-R/W), and/or a digital video disc (DVD).

In some embodiments, the storage medium 904 stores the computer program code 906 configured to cause system 900 to perform method 800A or 800B. In some embodiments, the storage medium 904 also stores information needed for performing method 800A or 800B as well as information generated during performing method 800A or 800B, such as layout design 916 and user interface 918, and/or a set of executable instructions to perform the operation of method 800A or 800B. In some embodiments, layout design 916 comprises one or more of layout designs 400, 500 or 700.

In some embodiments, the storage medium 904 stores instructions (e.g., computer program code 906) for interfacing with manufacturing machines. The instructions (e.g., computer program code 906) enable processor 902 to generate manufacturing instructions readable by the manufacturing machines to effectively implement method 800A or 800B during a manufacturing process.

System 900 includes I/O interface 910. I/O interface 910 is coupled to external circuitry. In some embodiments, I/O interface 910 includes a keyboard, keypad, mouse, trackball, trackpad, and/or cursor direction keys for communicating information and commands to processor 902.

System 900 also includes network interface 912 coupled to the processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interface such as ETHERNET, USB, or IEEE-1394. In some embodiments, method 800A or 800B is implemented in two or more systems 900, and information such as layout design, and user interface are exchanged between different systems 900 by network 914.

System 900 is configured to receive information related to a layout design through I/O interface 910 or network interface 912. The information is transferred to processor 902 by bus 908 to determine a layout design for producing integrated circuit structure 200, 1200 or 2400. The layout design is then stored in computer readable medium 904 as layout design 916. System 900 is configured to receive information related to a user interface through I/O interface 910 or network interface 912. The information is stored in computer readable medium 904 as user interface 918.

In some embodiments, method 800A or 800B is implemented as a standalone software application for execution by a processor. In some embodiments, method 800A or 800B is implemented as a software application that is a part of an additional software application. In some embodiments, method 800A or 800B is implemented as a plug-in to a software application. In some embodiments, method 800A or 800B is implemented as a software application that is a portion of an EDA tool. In some embodiments, method 800A or 800B is implemented as a software application that is used by an EDA tool. In some embodiments, the EDA tool is used to generate a layout of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 800A or 800B is implemented by a manufacturing device to manufacture an integrated circuit (e.g., integrated circuit 300) using a set of masks manufactured based on one or more layout designs (e.g., layout design 400-500, or 700) generated by system 900.

System 900 of FIG. 9 generates layout designs (e.g., layout design 400-500 or 700) of IC structure 300 that have longer bit line or bit line bar layout patterns than other approaches.

One aspect of this description relates to an integrated circuit structure. The integrated circuit structure includes a memory array. The memory array includes a column of cells arranged along a first direction and a bit line extending along the first direction over the column of cells. The column of cells includes a set of memory cells and a set of strap cells. The bit line includes a first conductor in a second conductor. The first conductor extends in the first direction and is in a first conductive layer. The second conductor extends in the first direction and is in a second conductive layer different from the first conductive layer. In some embodiments, the bit line further includes bit line segments, each bit line segment of the bit line segments being positioned in a corresponding cell of the set of strap cells or the set of memory cells. In some embodiments, the first conductor includes a first set of conductive segments extending in the first direction. In some embodiments, the second conductor includes a second set of conductive segments extending in the first direction. In some embodiments, each segment of the first set of conductive segments and each segment of the second set of conductive segments is positioned in the corresponding cell of the set of strap cells or the set of memory cells. In some embodiments, the memory array further includes a third conductor, a first via and a second via. In some embodiments, the third conductor extends in a second direction different from the first direction, and being in a third conductive layer different from the first conductive layer and the second conductive layer. In some embodiments, the first via is above a segment of the first set of conductive segments and below the third conductor, and electrically coupling the segment of the first set of conductive segments to the third conductor. In some embodiments, the second via is above the third conductor and below the segment of the set of second conductive segments, and electrically coupling the third conductor to the segment of the set of second conductive segments. In some embodiments, the third conductor, the first via and the second via are located in a first memory cell of the set of memory cells. In some embodiments, the first conductor and the second conductor are electrically coupled in a first strap cell of the set of strap cells. In some embodiments, the memory array further includes a second strap cell of the set of strap cells is separated from the first strap cell of the set of strap cells in the first direction by a first value, the first value ranging from 15 rows of memory cells to 127 rows of memory cells. In some embodiments, a strap cell in the set of strap cells includes a third conductor extending in the first direction, being in the first conductive layer, and coupled to a first supply voltage; a fourth conductor extending in a second direction different from the first direction, and being in a third conductive layer different from the first conductive layer and the second conductive layer; a fifth conductor extending in the first direction, and being in the second conductive layer; a first via above the third conductor and below the fourth conductor, and electrically coupling the third conductor to the fourth conductor; and a second via above the fourth conductor and below the fifth conductor, and electrically coupling the fourth conductor to the fifth conductor. In some embodiments, the first conductor is electrically coupled to the second conductor in a first memory cell of the set of memory cells. In some embodiments, the memory array further includes a bit line bar extending along the first direction and over the column of cells, the bit line bar being separated from the bit line in a second direction different from the first direction. In some embodiments, the bit line bar includes a third conductor extending in the first direction and being in the first conductive layer; and a fourth conductor extending in the first direction and being in the second conductive layer. In some embodiments, the bit line bar further includes bit line bar segments, each bit line bar segment of the bit line bar segments being positioned in the corresponding cell of the set of strap cells or the set of memory cells. In some embodiments, the third conductor includes a third set of conductive segments extending in the first direction. In some embodiments, the fourth conductor includes a fourth set of conductive segments extending in the first direction. In some embodiments, each segment of the third set of conductive segments and each segment of the fourth set of conductive segments is positioned in the corresponding cell of the set of strap cells or the set of memory cells.

Another aspect of this description relates to a memory array. The memory array includes a first memory cell, a second memory cell and a bit line. The first memory cell configured to store data. The second memory cell configured to store data. The first memory cell and the second memory cell being arranged along a first direction in a first column of memory cells. The bit line extending along the first direction, and being over the first memory cell and the second memory cell. The bit line includes a first conductor in a second conductor. The first conductor extending in the first direction, and being in a first conductive layer. The second conductor extending in the first direction, and being in a second conductive layer different from the first conductive layer. In some embodiments, the first conductor includes a first conductive segment and a second conductive segment, the first conductive segment and the second conductive segment each extend in the first direction and being in the first conductive layer. In some embodiments, the second conductor includes a third conductive segment and a fourth conductive segment, the third conductive segment and the fourth conductor segment each extend in the first direction and being in the second conductive layer. In some embodiments, the first conductive segment and the third conductive segment are positioned in the first memory cell. In some embodiments, the second conductive segment and the fourth conductive segment are positioned in the second memory cell. In some embodiments, the first conductive segment is coupled to the third conductive segment in the first memory cell. In some embodiments, the second conductive segment is not coupled to the fourth conductive segment in the second memory cell. In some embodiments, the second conductive segment is coupled to the fourth conductive segment in the second memory cell. In some embodiments, the memory array further includes a first memory cell array between the first memory cell and the second memory cell, the first memory cell array having a number of rows of memory cells ranging from 3 rows of memory cells to 15 rows of memory cells. In some embodiments, each of the memory cells of the first memory cell array positioned in the first column of memory cells includes a corresponding fifth conductive segment between the first conductive segment and the second conductive segment, and being in the first conductive layer; and a corresponding sixth conductive segment between the third conductive segment and the fourth conductive segment, and being in the second conductive layer. In some embodiments, the corresponding fifth conductive segment of each memory cell in the first memory cell array is not coupled to the corresponding sixth conductive segment of each memory cell in the first memory cell array. In some embodiments, the memory array further includes a fifth conductive segment, a first via and a second via. In some embodiments, the fifth conductive segment extending in a second direction different from the first direction, and being in a third conductive layer different from the first conductive layer and the second conductive layer. In some embodiments, the first via above the first conductive segment and below the fifth conductive segment, and electrically coupling the first conductive segment to the fifth conductive segment. In some embodiments, the second via above the fifth conductive segment and below the third conductive segment, and electrically coupling the fifth conductive segment to the third conductive segment.

Still another aspect of this disclosure relates to a memory array. The memory array includes a first column of cells arranged along a first direction and a first bit line bar extending along the first direction over the first column of cells. In some embodiments, the first column of cells include a first memory cell and a second memory cell. In some embodiments, the bit line bar includes a first conductor extending in the first direction and being in a first conductive layer, and a second conductor extending in the first direction and being in a second conductive layer different from the first conductive layer. In some embodiments, the first conductor is electrically coupled to the second conductor in the at least the first memory cell or the second memory cell. In some embodiments, the memory array further includes a second column of cells arranged along the first direction and a second bit line bar extending along the first direction over the second column of cells. In some embodiments, the second column of cells being separated from the first column of cells in a second direction different from the first direction. In some embodiments, the second column of cells include a third memory cell and a fourth memory cell. In some embodiments, the second bit line bar includes a third conductor extending in the first direction and being in the first conductive layer, and a fourth conductor extending in the first direction and being in the second conductive layer. In some embodiments, the third conductor is electrically coupled to the fourth conductor in at least the third memory cell or the fourth memory cell.

Still another aspect of this disclosure relates to a method of forming a memory array circuit. The method includes generating, by a processor, a layout design of the memory array circuit, and manufacturing the memory array circuit based on the layout design. In some embodiments, generating the layout design includes generating a first memory cell layout pattern, generating a second memory cell layout pattern, and generating a bit line layout pattern. In some embodiments, generating the first memory cell layout pattern corresponding to fabricating a first memory cell of the memory cell array circuit configured to store data. In some embodiments, generating the second memory cell layout pattern corresponding to fabricating a second memory cell of the memory cell array circuit configured to store data, the second memory cell layout pattern being separated from the first memory cell layout pattern in a first direction. In some embodiments, generating the bit line layout pattern corresponding to fabricating a bit line of the memory array circuit, the bit line layout pattern extending in the first direction. In some embodiments, generating the bit line layout pattern includes generating a first conductive feature layout pattern corresponding to fabricating a first conductive segment of the bit line, the first conductive feature layout pattern extending in the first direction and being on a first layout level; generating a second conductive feature layout pattern corresponding to fabricating a second conductive segment of the bit line, the second conductive feature layout pattern extending in the first direction and being on a second layout level different from the first layout level; generating a third conductive feature layout pattern corresponding to fabricating a third conductive segment, the third conductive feature layout pattern extending in a second direction, and being on a third layout level different from the first layout level and the second layout level, the second direction being different from the first direction; generating a first via layout pattern corresponding to fabricating a first via coupled between the first conductive segment of the bit line and the third conductive segment, the first via layout pattern being located where the third conductive feature layout pattern overlaps the first conductive feature layout pattern; and generating a second via layout pattern corresponding to fabricating a second via coupled between the second conductive segment of the bit line and the third conductive segment, the second via layout pattern being located where the second conductive feature layout pattern overlaps the third conductive feature layout pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array comprising:
   a column of cells arranged along a first direction, the column of cells comprising a set of memory cells and a set of strap cells;
   a bit line extending along the first direction over the column of cells, the bit line comprising:
      a first conductor extending in the first direction and being in a first conductive layer; and
      a second conductor extending in the first direction and being in a second conductive layer different from the first conductive layer; and
   a bit line bar extending along the first direction over the column of cells, the bit line bar comprising:
      a third conductor extending in the first direction and being in the first conductive layer; and
      a fourth conductor extending in the first direction and being in the second conductive layer.

2. The memory array of claim 1, wherein a strap cell of the set of strap cells comprises:
   a fifth conductor extending in the first direction, being in the first conductive layer, and coupled to a first supply voltage;
   a sixth conductor extending in a second direction different from the first direction, and being in a third conductive layer different from the first conductive layer and the second conductive layer;
   a seventh conductor extending in the first direction, and being in the second conductive layer;
   a first via above the fifth conductor and below the sixth conductor, and electrically coupling the fifth conductor to the sixth conductor; and
   a second via above the sixth conductor and below the seventh conductor, and electrically coupling the sixth conductor to the seventh conductor.

3. The memory array of claim 1, wherein
   the first conductor comprises a first set of conductive segments extending in the first direction;
   the second conductor comprises a second set of conductive segments extending in the first direction; and
   each pair of conductive segments of the first set of conductive segments and each pair of conductive segments of the second set of conductive segments is positioned in a corresponding cell of the set of strap cells or the set of memory cells.

4. The memory array of claim 3, further comprising:
   a fifth conductor extending in a second direction different from the first direction, and being in a third conductive layer different from the first conductive layer and the second conductive layer;
   a first via above a conductive segment of the first set of conductive segments and below the fifth conductor, and electrically coupling the conductive segment of the first set of conductive segments to the fifth conductor; and
   a second via above the fifth conductor and below a conductive segment of the second set of conductive segments, and electrically coupling the fifth conductor to the conductive segment of the second set of conductive segments,
   wherein the fifth conductor, the first via and the second via are located in a first memory cell of the set of memory cells.

5. A memory array comprising:
   a first column of cells arranged along a first direction, the first column of cells comprising a first memory cell and a second memory cell;
   a first bit line bar extending along the first direction over the first column of cells, the first bit line bar comprising:

a first conductor extending in the first direction and being in a first conductive layer; and a second conductor extending in the first direction and being in a second conductive layer different from the first conductive layer, wherein the first conductor is electrically coupled to the second conductor in at least the first memory cell or the second memory cell.

6. The memory array of claim 5, further comprising:

a second column of cells arranged along the first direction, the second column of cells being separated from the first column of cells in a second direction different from the first direction, the second column of cells comprising a third memory cell and a fourth memory cell, and a second bit line bar extending along the first direction over the second column of cells, the second bit line bar comprising:

a third conductor extending in the first direction and being in the first conductive layer; and a fourth conductor extending in the first direction and being in the second conductive layer, the third conductor is electrically coupled to the fourth conductor in at least the third memory cell or the fourth memory cell.

7. The memory array of claim 5, wherein the first column of cells further comprises:

a set of strap cells.

8. The memory array of claim 7, wherein a strap cell of the set of strap cells comprises:

a third conductor extending in the first direction, being in the first conductive layer, and coupled to a first supply voltage;

a fourth conductor extending in a second direction different from the first direction, and being in a third conductive layer different from the first conductive layer and the second conductive layer;

a fifth conductor extending in the first direction, and being in the second conductive layer;

a first via above the third conductor and below the fourth conductor, and electrically coupling the third conductor to the fourth conductor; and a second via above the fourth conductor and below the fifth conductor, and electrically coupling the fourth conductor to the fifth conductor.

9. The memory array of claim 5, wherein the first conductor comprises a first set of conductive segments extending in the first direction;

the second conductor comprises a second set of conductive segments extending in the first direction; and each pair of conductive segments of the first set of conductive segments and each pair of conductive segments of the second set of conductive segments is positioned in the first memory cell and the second memory cell.

10. The memory array of claim 9, further comprising:

a third conductor extending in a second direction different from the first direction, and being in a third conductive layer different from the first conductive layer and the second conductive layer;

a first via above a conductive segment of the first set of conductive segments and below the third conductor, and electrically coupling the conductive segment of the first set of conductive segments to the third conductor; and a second via above the third conductor and below a conductive segment of the second set of conductive segments, and electrically coupling the third conductor to the conductive segment of the second set of conductive segments, wherein the third conductor, the first via and the second via are located in the first memory cell or the second memory cell.

11. A memory array comprising:

a column of cells arranged along a first direction, the column of cells comprising a set of memory cells and a set of strap cells, and a bit line extending along the first direction over the column of cells, the bit line comprising:

a first conductor extending in the first direction and being in a first conductive layer; and a second conductor extending in the first direction and being in a second conductive layer different from the first conductive layer.

12. The memory array of claim 11, wherein the bit line further comprises:

bit line segments, each bit line segment of the bit line segments being positioned in a corresponding cell of the set of strap cells or the set of memory cells.

13. The memory array of claim 11, wherein a strap cell of the set of strap cells comprises:

a third conductor extending in the first direction, being in the first conductive layer, and coupled to a first supply voltage;

a fourth conductor extending in a second direction different from the first direction, and being in a third conductive layer different from the first conductive layer and the second conductive layer;

a fifth conductor extending in the first direction, and being in the second conductive layer;

a first via above the third conductor and below the fourth conductor, and electrically coupling the third conductor to the fourth conductor; and a second via above the fourth conductor and below the fifth conductor, and electrically coupling the fourth conductor to the fifth conductor.

14. The memory array of claim 11, wherein the first conductor is electrically coupled to the second conductor in a first memory cell of the set of memory cells.

15. The memory array of claim 11, wherein the first conductor comprises a first set of conductive segments extending in the first direction;

the second conductor comprises a second set of conductive segments extending in the first direction; and each pair of conductive segments of the first set of conductive segments and each pair of conductive segments of the second set of conductive segments is positioned in a corresponding cell of the set of strap cells or the set of memory cells.

16. The memory array of claim 3, further comprising:

a third conductor extending in a second direction different from the first direction, and being in a third conductive layer different from the first conductive layer and the second conductive layer;

a first via above a segment of the first set of conductive segments and below the third conductor, and electrically coupling the segment of the first set of conductive segments to the third conductor; and a second via above the third conductor and below a segment of the second set of conductive segments, and electrically coupling the third conductor to the segment of the second set of conductive segments, wherein the third conductor, the first via and the second via are located in a first memory cell of the set of memory cells.

17. The memory array of claim 11, wherein the first conductor and the second conductor are electrically coupled in a first strap cell of the set of strap cells.

18. The memory array of claim 17, further comprising:
a second strap cell of the set of strap cells is separated from the first strap cell of the set of strap cells in the first direction by a first value, the first value ranging from 15 rows of memory cells to 128 rows of memory cells.

19. The memory array of claim 11, further comprising:
a bit line bar extending along the first direction and over the column of cells, the bit line bar being separated from the bit line in a second direction different from the first direction, the bit line bar comprising:
 a third conductor extending in the first direction and being in the first conductive layer; and
 a fourth conductor extending in the first direction and being in the second conductive layer.

20. The memory array of claim 19, wherein
the third conductor comprises a first set of conductive segments extending in the first direction; and
the fourth conductor comprises a second set of conductive segments extending in the first direction,
each pair of conductive segments of the first set of conductive segments and each pair of conductive segments of the second set of conductive segments is positioned in a corresponding cell of the set of strap cells or the set of memory cells.

\* \* \* \* \*